(12) United States Patent
Liu et al.

(10) Patent No.: US 12,230,344 B2
(45) Date of Patent: Feb. 18, 2025

(54) WORD LINE LAYER DEPENDENT STRESS AND SCREEN VOLTAGE

(71) Applicant: Western Digital Technologies, Inc., San Jose, CA (US)

(72) Inventors: Yidan Liu, Shanghai (CN); Chao Xu, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 54 days.

(21) Appl. No.: 18/356,801

(22) Filed: Jul. 21, 2023

(65) Prior Publication Data
US 2024/0161849 A1  May 16, 2024

Related U.S. Application Data

(60) Provisional application No. 63/424,652, filed on Nov. 11, 2022.

(51) Int. Cl.
*G11C 29/00* (2006.01)
*G11C 29/12* (2006.01)

(52) U.S. Cl.
CPC ............... *G11C 29/12005* (2013.01); *G11C 2029/1202* (2013.01)

(58) Field of Classification Search
CPC ............ G11C 8/12; G11C 29/12005; G11C 2029/1202
See application file for complete search history.

(56) References Cited

U.S. PATENT DOCUMENTS

| 8,379,454 | B2 | 2/2013 | Kochar et al. | |
| 9,224,502 | B1 | 12/2015 | Sabde et al. | |
| 9,343,171 | B1* | 5/2016 | Sun | G11C 11/5635 |
| 9,449,694 | B2 | 9/2016 | Paudel et al. | |
| 9,460,805 | B1* | 10/2016 | Pang | G11C 16/08 |
| 9,721,662 | B1* | 8/2017 | Yang | G11C 16/3459 |
| 9,934,872 | B2 | 4/2018 | Magia et al. | |
| 10,008,276 | B2 | 6/2018 | Huynh et al. | |
| 10,573,397 | B1 | 2/2020 | Sehgal et al. | |
| 10,770,165 | B1* | 9/2020 | Cai | G11C 16/0483 |
| 11,335,411 | B1* | 5/2022 | Lien | G11C 16/14 |
| 11,342,029 | B2* | 5/2022 | Oowada | G11C 16/26 |

(Continued)

OTHER PUBLICATIONS

ONFI, "Open NAND Flash Interface Specification," Rev. 5.1, May 3, 2022, 398 pages.

*Primary Examiner* — Esaw T Abraham
(74) *Attorney, Agent, or Firm* — Pearl Cohen Zedek Latzer Baratz LLP

(57) ABSTRACT

Technology is disclosed for testing a 3D memory structure. The 3D memory structure has blocks with layers of word lines. Each word line is connected to control gates of NAND memory cells. The 3D memory structure may be tested while concurrently applying a set of layer dependent voltages to a corresponding set of word lines. The magnitude of each layer dependent voltage may depend on which layer the word line to which the voltage is applied resides. There may be physical differences between the different layers such as differences in the diameters of the memory holes in which NAND string are formed. The layer dependent voltages provide for a more accurate test in view of these and other physical differences between the different layers.

20 Claims, 17 Drawing Sheets

(56) References Cited

U.S. PATENT DOCUMENTS

| | | | | |
|---|---|---|---|---|
| 11,790,992 B2* | 10/2023 | Lien | ............... | G11C 16/08 |
| | | | | 365/185.03 |
| 11,854,620 B2* | 12/2023 | Penzo | ............... | G11C 11/5628 |
| 11,935,593 B2* | 3/2024 | Song | ............... | G11C 16/28 |
| 11,942,157 B2* | 3/2024 | Guo | ............... | G11C 16/24 |
| 11,990,185 B2* | 5/2024 | Yang | ............... | G11C 16/16 |
| 12,046,302 B2* | 7/2024 | Yang | ............... | G11C 16/3459 |

* cited by examiner

| BL | VSS (0V) |
|---|---|
| SGD | Vsgd |
| DD | Vpass |
| Upper Data WLs | Vpgmu |
| WLIFDU | Vpass |
| WLIFDL | Vpass |
| Lower Data WLs | Vpgmu |
| DS | Vpass |
| SGS | Vsgs |
| SL | VSS (0V) |

| WL111 | F_DVPGM_WL111 |
|---|---|
| WL110 | F_DVPGM_WL110 |
| WL Layer6 | F_DVPGM_L6 |
| WL Layer5 | F_DVPGM_L5 |
| WL Layer4 | F_DVPGM_L4 |
| WL Layer3 | F_DVPGM_L3 |
| WL56 | F_DVPGM_WL56 |
| WL55 | F_DVPGM_WL55 |
| WL Layer2 | F_DVPGM_L2 |
| WL Layer1 | F_DVPGM_L1 |
| WL Layer0 | F_DVPGM_L0 |
| WL1 | F_DVPGM_WL1 |
| WL0 | F_DVPGM_BWL |

WORD LINE LAYER DEPENDENT STRESS AND SCREEN VOLTAGE

CLAIM OF PRIORITY

The present application claims priority from U.S. Provisional Patent Application No. 63/424,652, entitled "WORD LINE LAYER DEPENDENT STRESS AND SCREEN VOLTAGE," by Liu et al., filed Nov. 11, 2022, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Following manufacturing defects may exist in the memory structure. For example, there could be a short circuit between a word line and a NAND string. There could be a short circuit between a word line and conductive line such as a source line. Such defects can result in dysfunction of memory operations such as erase, program, and/or read. Such defects can potentially result in data loss. Therefore, the memory structure is typically tested after manufacture to detect such defects. Regions of the memory structure having a defect may be retired. For example, a block of memory cells that contains a defect may be marked as a bad block such that it is not used in the field.

One way to test the memory structure is to perform an operation such as program to determine whether the memory cells can be successfully programmed. Another way to test the memory structure is a stress test, which may look for short circuits that result in leakage currents. It is desirable to perform such tests accurately and relatively quickly.

BRIEF DESCRIPTION OF THE DRAWINGS

Like-numbered elements refer to common components in the different figures.

FIG. 11 is a table that provides further details of voltages applied during an embodiment of process.

FIG. 12 is a table that provides further details of layer dependent voltages applied during testing of a 3D memory structure.

DETAILED DESCRIPTION

Technology is disclosed herein for testing a three-dimensional memory structure that may contain NAND strings. The three-dimensional memory structure may be divided into blocks with each block having a number of word lines. The word lines may be connected to control gates of the NAND memory cells. In an embodiment, the three-dimensional memory structure is tested while concurrently applying a set of location dependent voltages to a corresponding set of word lines in a block. The magnitude of each location dependent voltage may depend on which layer the word line resides. There may be physical differences between the different layers such as differences in the diameters of the memory holes in which the NAND string are formed. The location dependent voltages may provide for a more accurate test in view of these and other physical differences between the different layers. In an embodiment, the word lines to which the location dependent voltages are applied are referred to as "selected word lines". As defined herein a selected word line means a word line that is selected for an operation such as program, erase, read, or a stress test. For example, a word line that is selected for program means that a program voltage is applied to that word line such that a set of memory cells (though not necessarily all cells) connected to the word line are to be programmed. As another example, a word line that is selected for a stress test means that a stress voltage is applied to the word line.

In an embodiment, the voltages that are concurrently applied to the word lines are program voltages. The program voltages may be used to program a test pattern into the memory cells in order to test whether the memory cells can be properly programmed. In an embodiment, the voltages that are concurrently applied to the word lines are stress voltages that are used to determine whether there is a defect that results in a leakage current. For example, the memory structure could be tested for a short circuit between a word line and a source line or between a word line and a NAND channel. In an embodiment, the three-dimensional memory structure is tested during a built-in self-test (BIST). For example, electronic circuitry within the memory system may test the three-dimensional memory structure while applying the location dependent voltages to the word lines.

Figure 1:
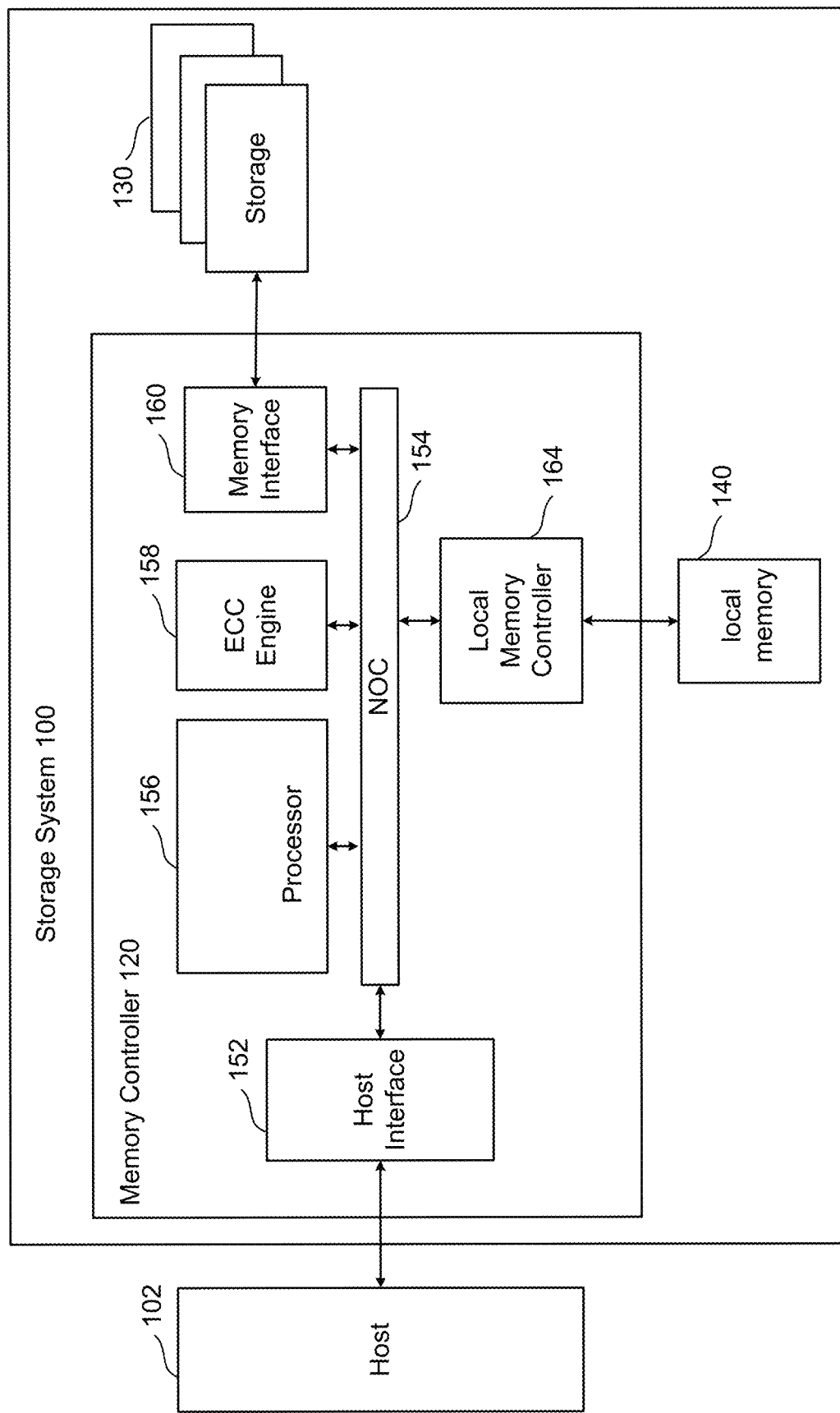
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102. In some embodiments, the technology described herein is implemented within a portion of the storage system 100, such as in storage 130.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
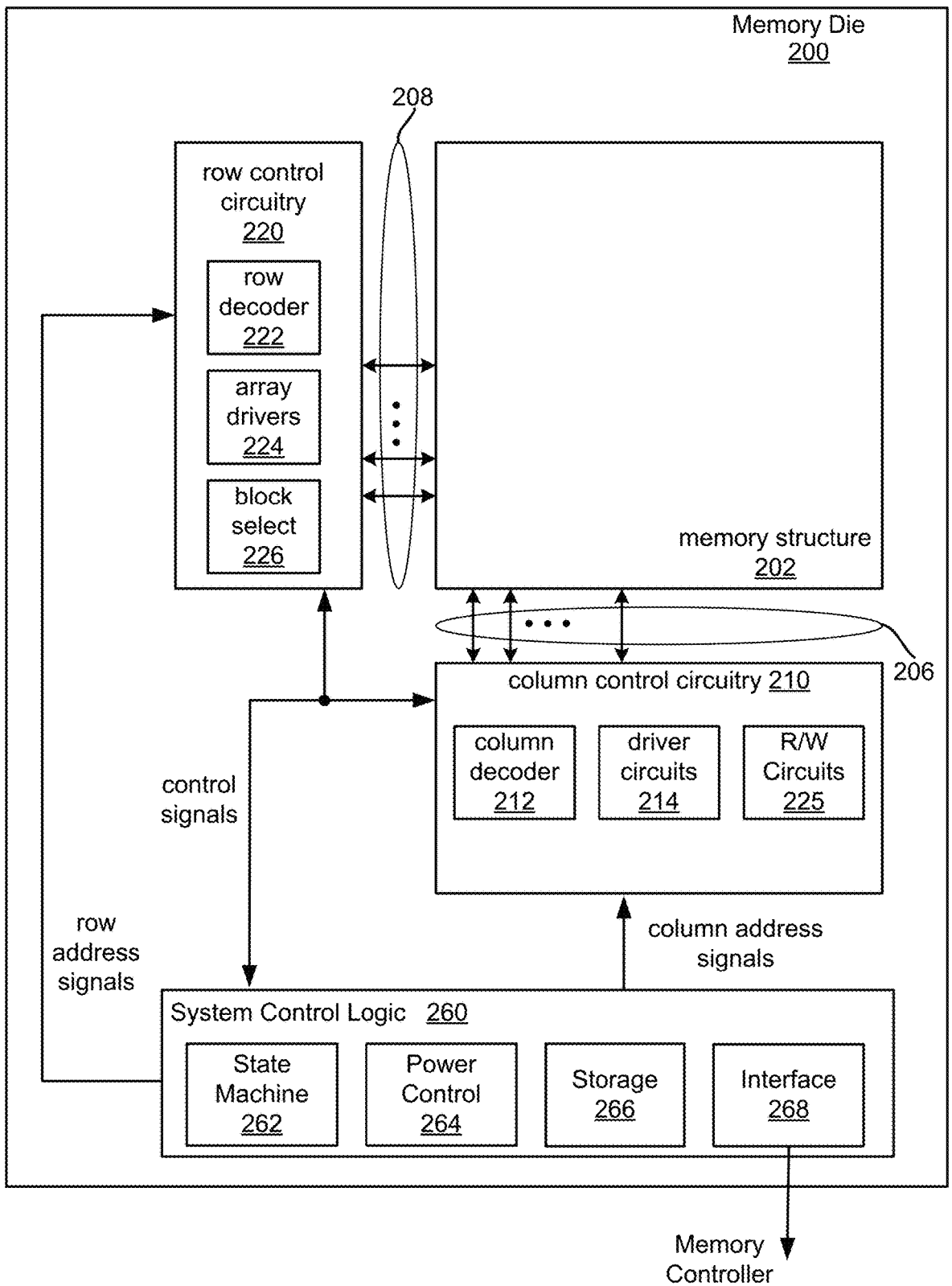
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. The parameters may specify voltages to apply to word lines when testing the memory structure 202. In an embodiment, the magnitude of the voltages applied to the word lines when testing the memory structure 202 depend on what layer the word line resides. The physical characteristics of the memory structure 202 may differ depending on the layer. Using different magnitude voltages during test, depending on the layer, can account for such difference and therefore provide for a more accurate test of the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
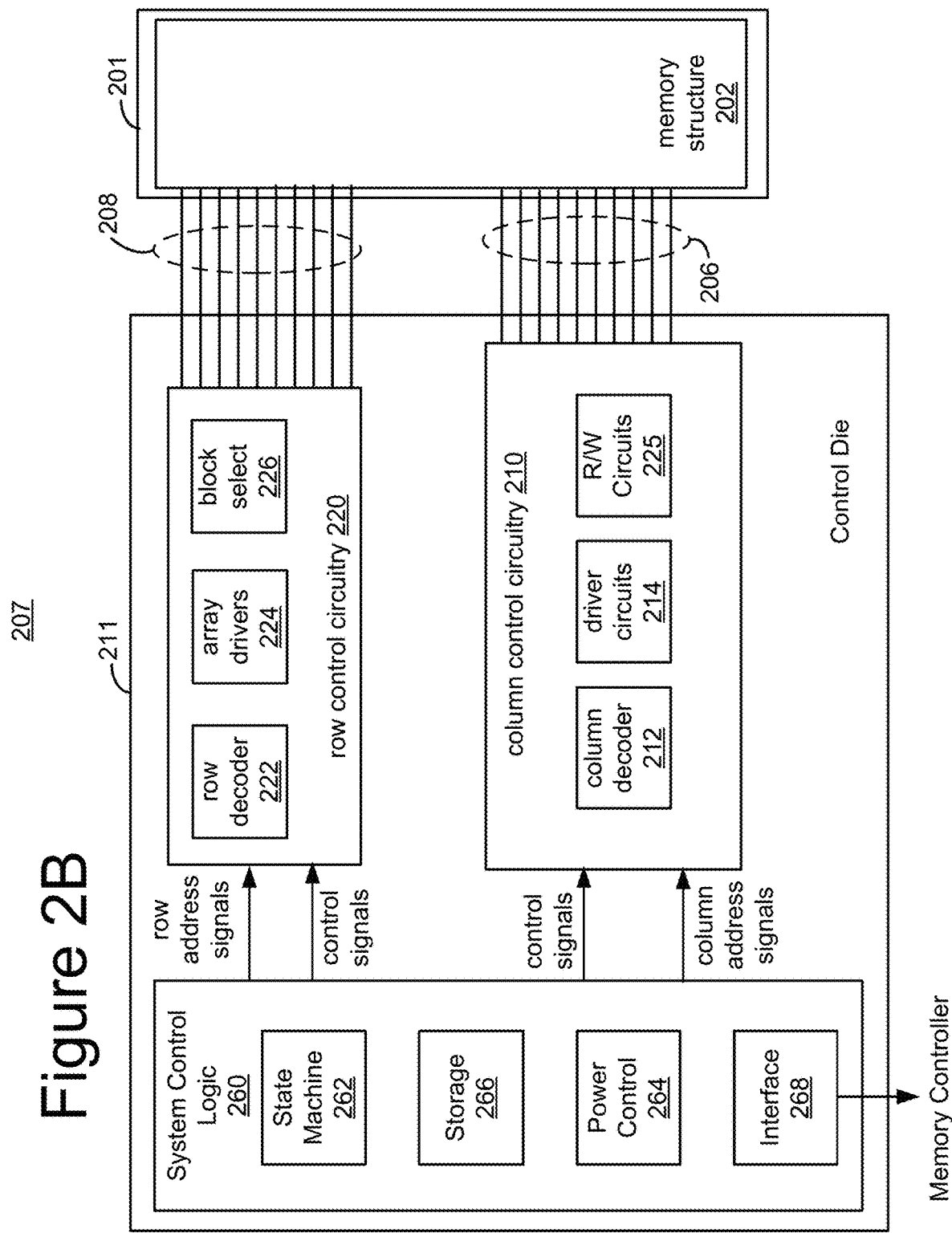
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
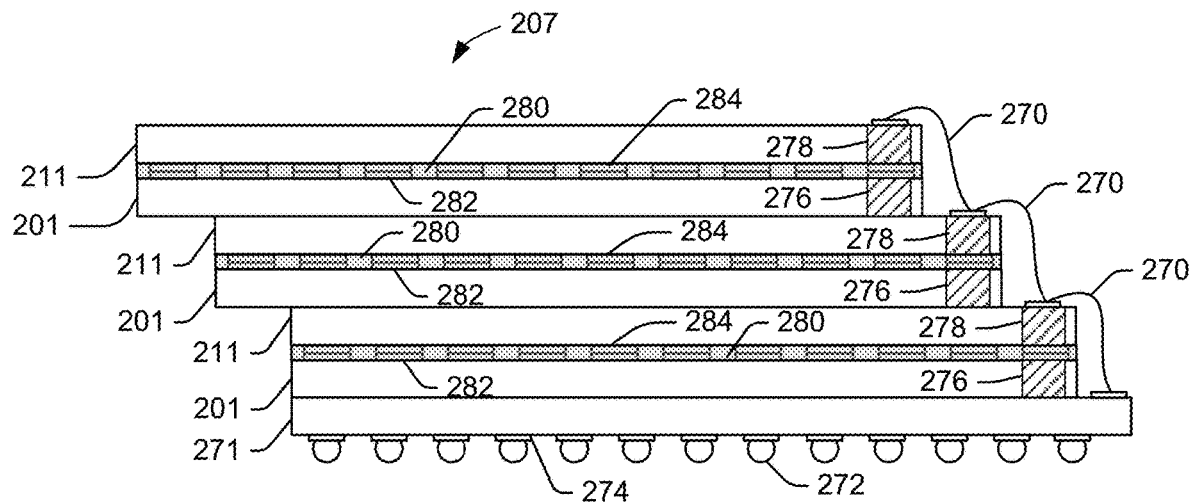
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
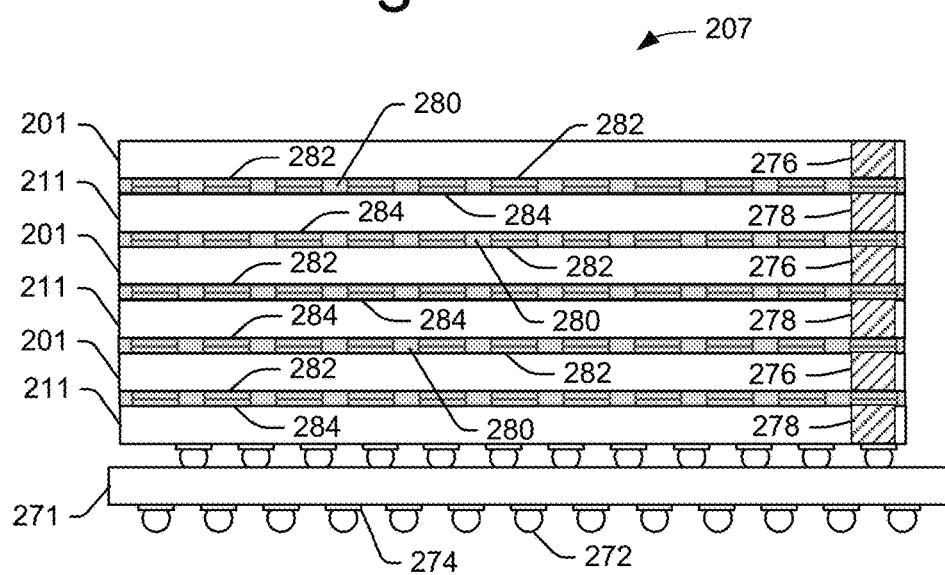

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
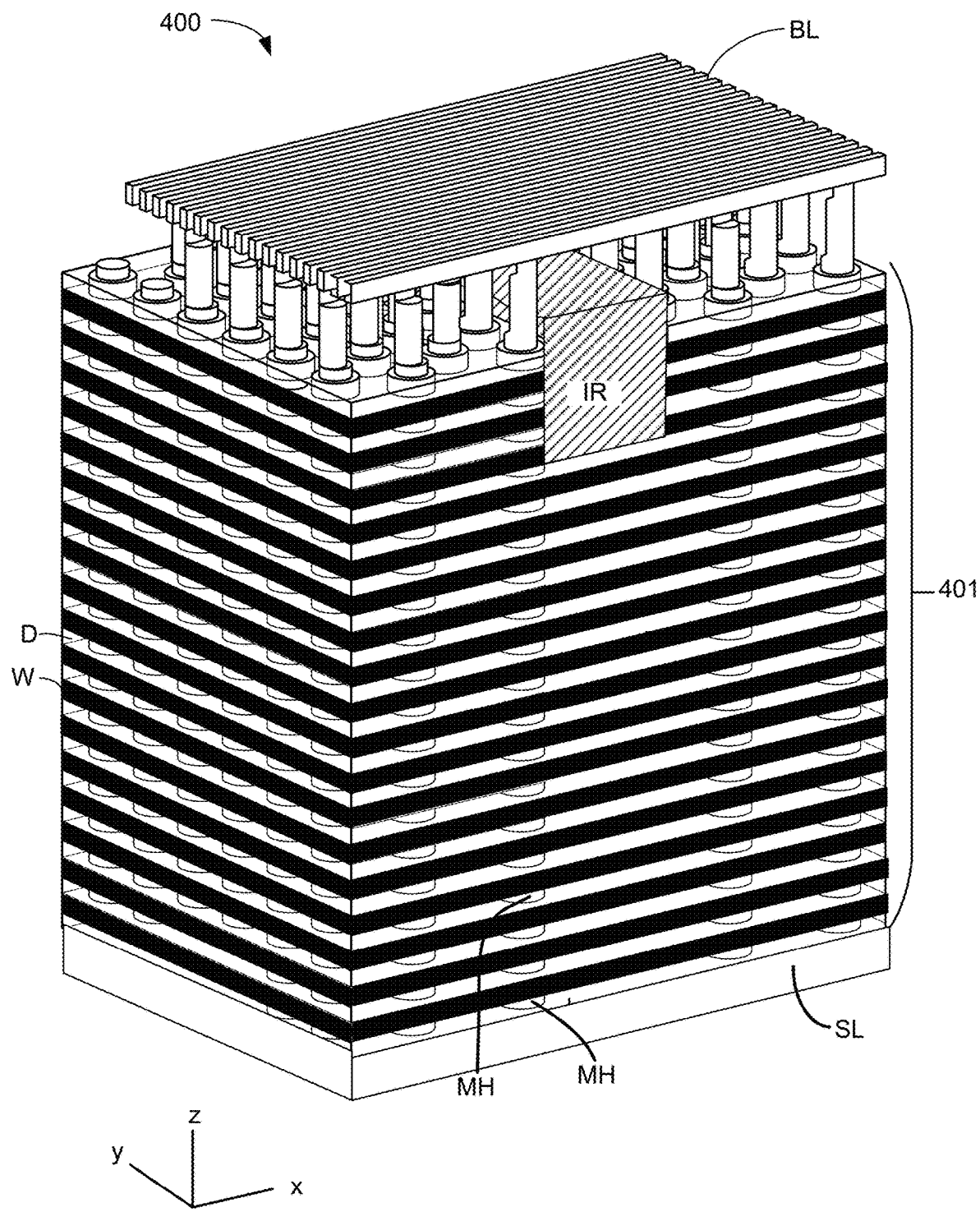
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
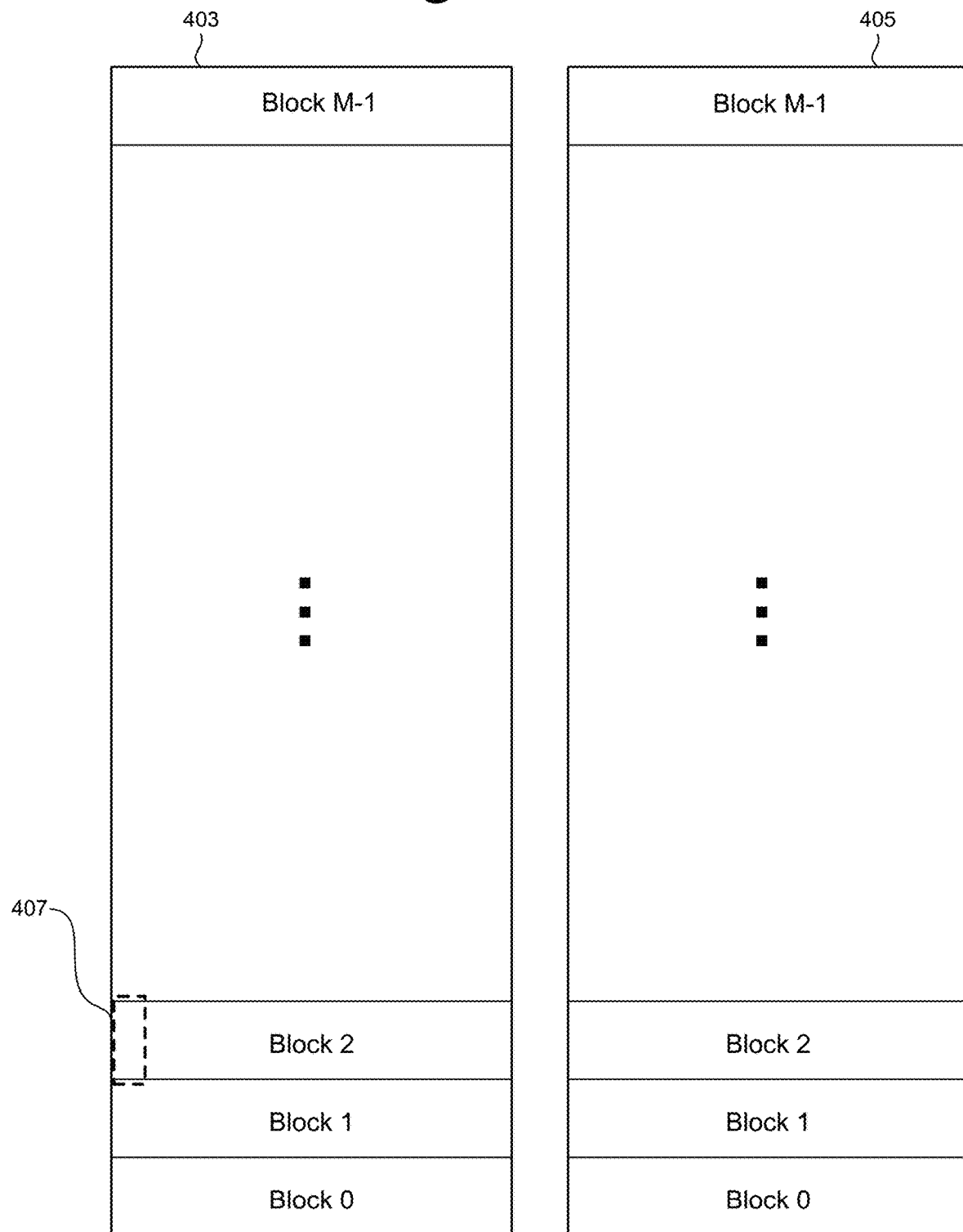
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
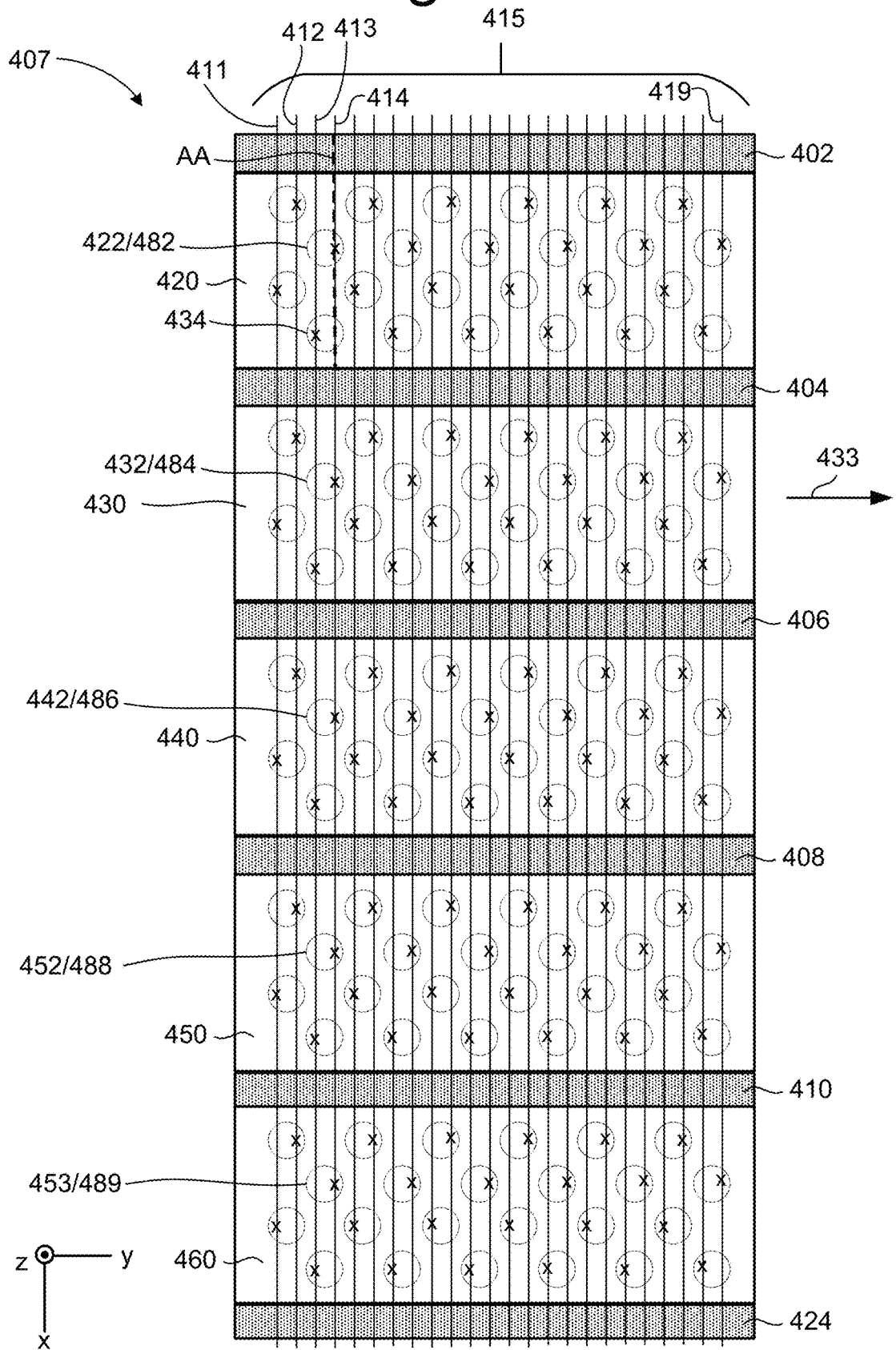
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of SiO₂; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
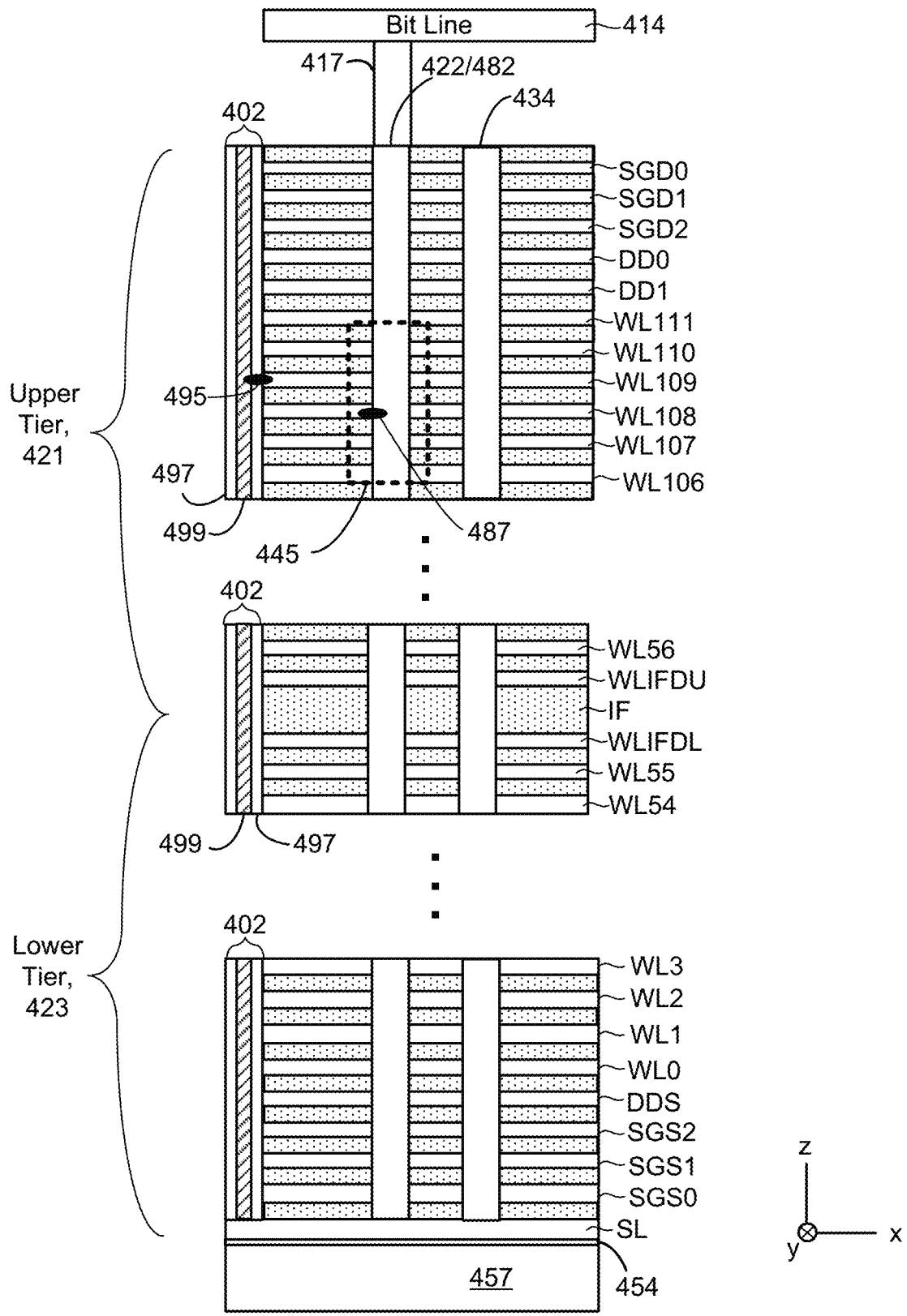
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIDDL, DDS; one hundred twelve word line layers WL0-WL111 for connecting to data memory cells. Dielectric layers are depicted between the conductive layers just described. Other embodiments can implement more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 422 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 422 has a source end at a bottom of the stack and a drain end at a top of the stack. As in agreement with FIG. 4B, FIG. 4C show vertical column 422 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. The conductive region 499 may be formed from, for example, tungsten. The insulating material 497 may be formed from, for example, silicon oxide. It is possible for a short circuit to occur between a word line and the conductive region 499. An example defect 495 that results in a short circuit between WL109 and the conductive region 499 is depicted. The conductive region 499 may be referred to herein as a local interconnect (LI). In one embodiment, such word line to LI short circuits are detected in which the magnitude of the voltage applied to the word line depends on what layer the word line resides. Defects such as defect 495 may be present when the memory structure is manufactured or may develop as a result of normal memory operations.

Another type of short circuit that may be detected is a word line to memory hole short circuit. Defect 487 may result in a short circuit between WL108 and the memory hole 422. In one embodiment, such word line to memory hole short circuits are detected in which the magnitude of the voltage applied to the word line depends on what layer the word line resides. Defects such as defect 487 may be present when the memory structure is manufactured or may develop as a result of normal memory operations.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W111 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
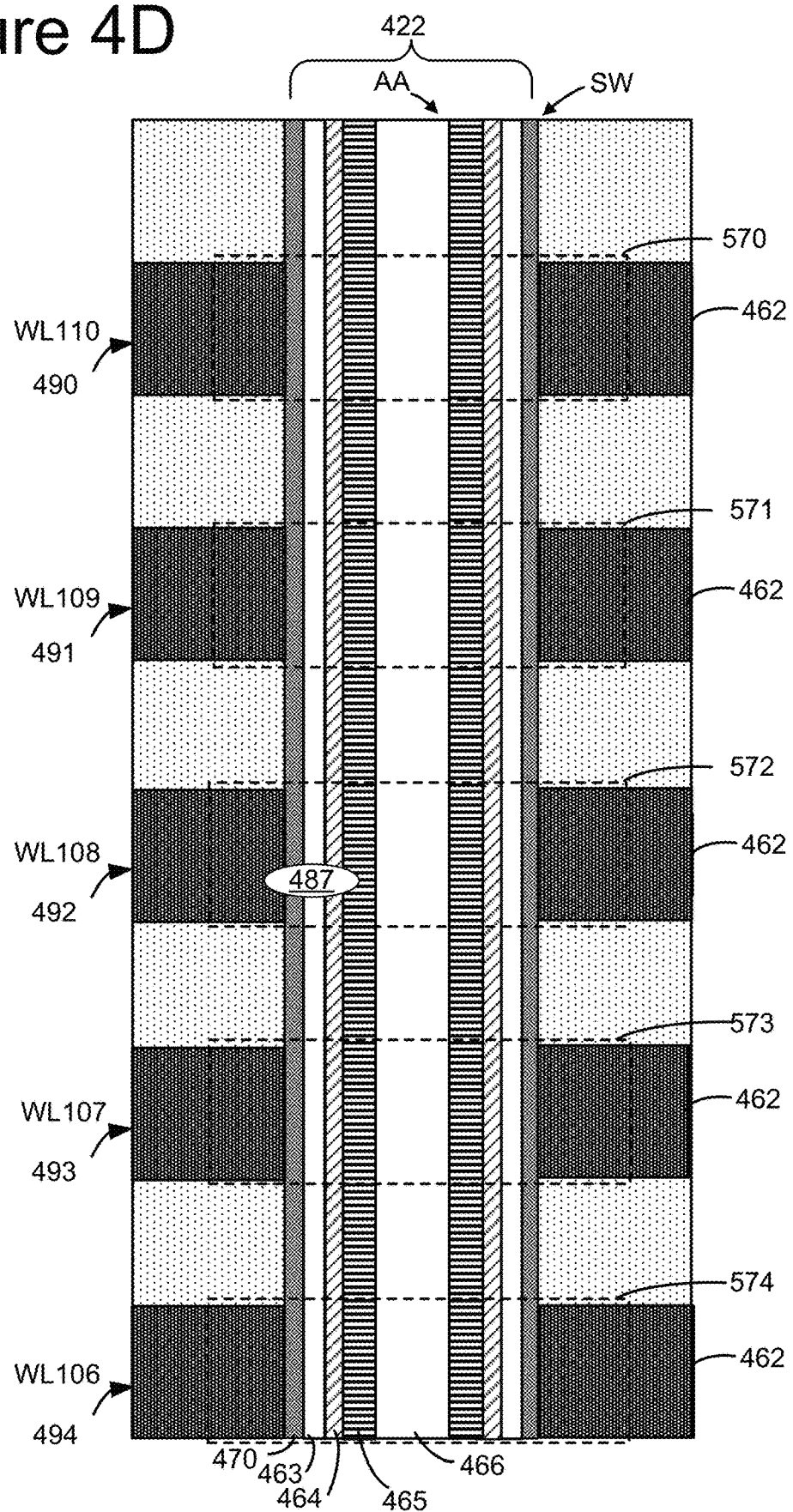
FIG. 4D depicts a view of the region 445 of FIG. 4C.

FIG. 4D depicts a view of the region 445 of FIG. 4C. Included are WL106-110 and dielectric layers between the word line layers. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

As mentioned above, one type of short circuit that may be detected is a word line to memory hole short circuit. Defect 487 may result in a short circuit between WL108 and one or more of the layers in the memory hole 422 such as, for example, charge-trapping layer 463 and/or polysilicon body 465. In one embodiment, such word line to memory hole short circuits are detected in which the magnitude of the voltage applied to the word line depends on what layer the word line resides. Note that the diameter of the memory hole 422 may depend on what layer the word line is in. Using the layer dependent voltage can account for layer dependent differences in memory hole diameter, as well as other physical differences between the layers.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
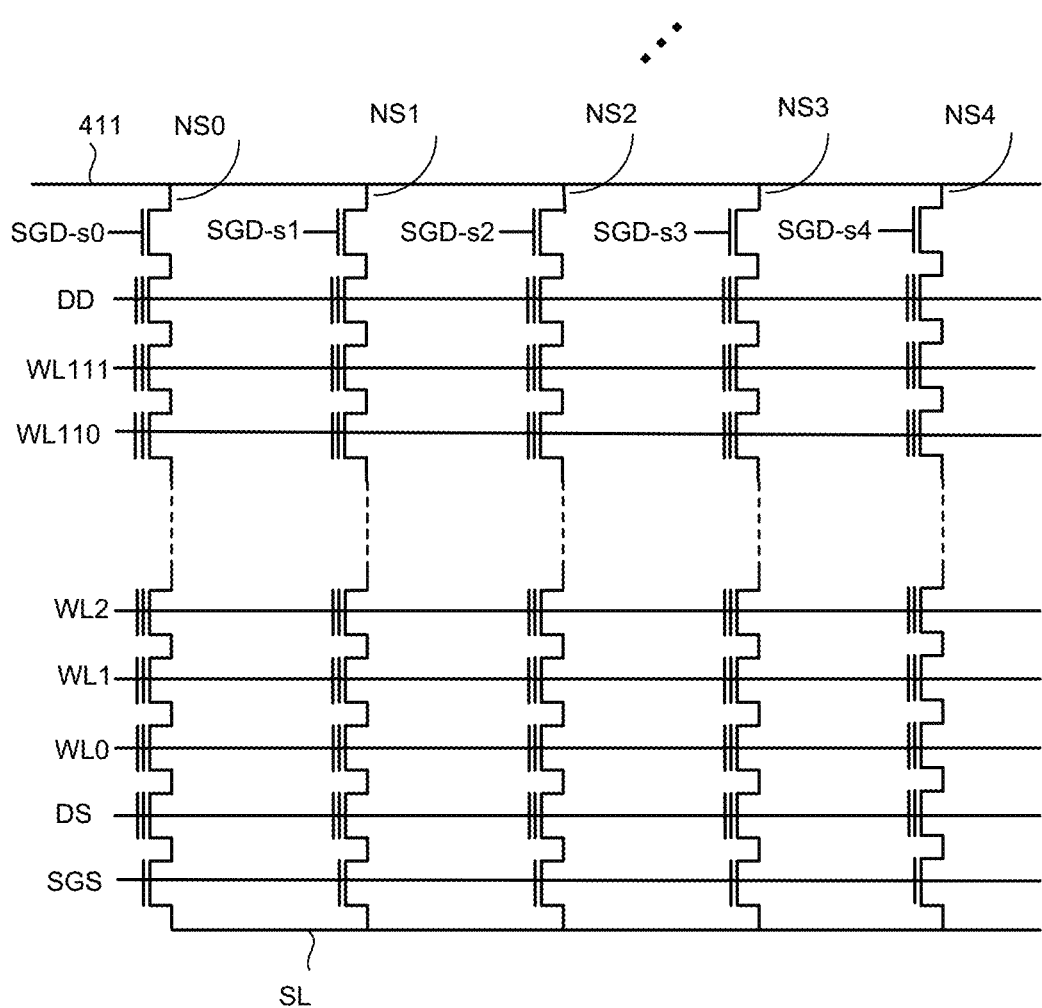
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL111 running across the entire block. The structure of FIG. 4E corresponds to portion 407 in Block 2 of FIGS. 4A-4B, including bit lines 411, 412, 413, 414, . . . 419. Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block. FIG. 4E shows that SGD select line connects to an SGD transistor on one of the NAND strings. There are many other NAND strings in the block that are not depicted in FIG. 4E. Each SGD select line will connect to all of the NAND strings on one sub-block. The SGD transistor may be used to connect/disconnect the NAND string channel to/from the bit line.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

Figure 5:
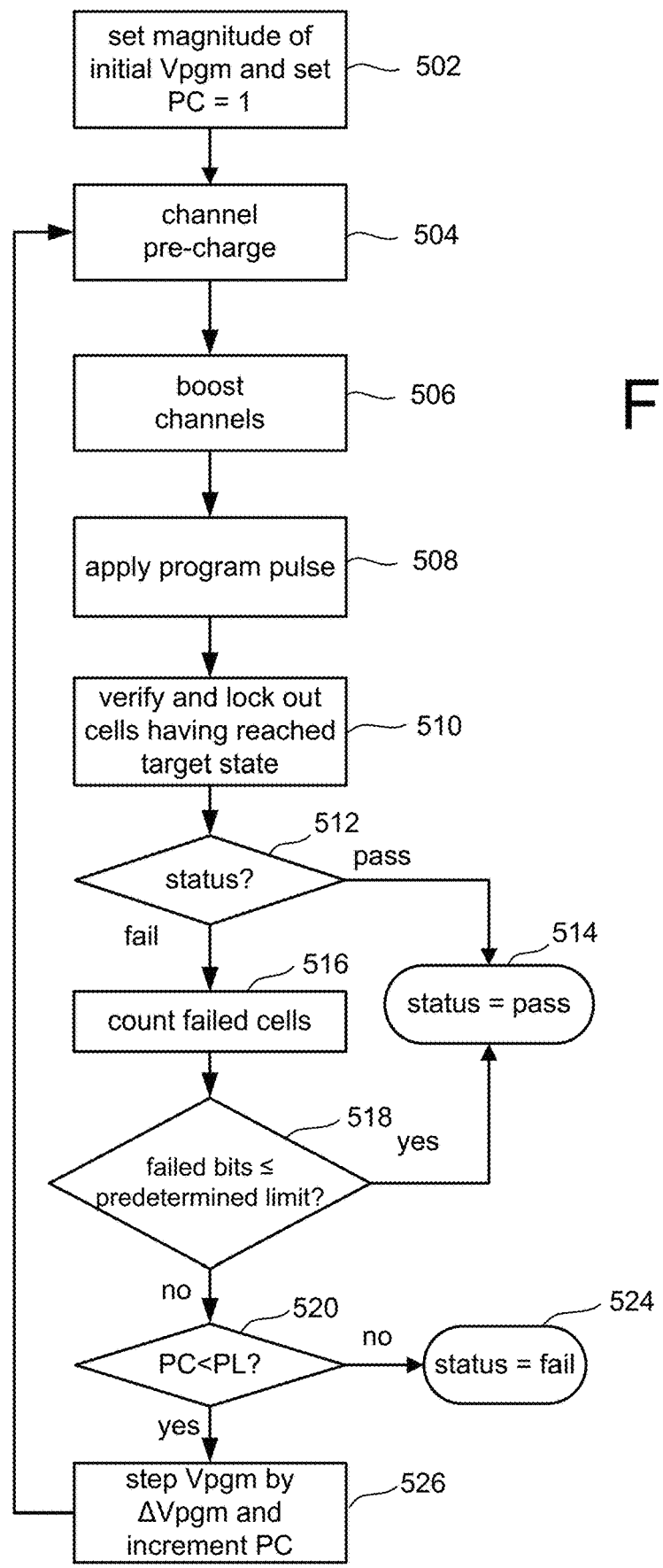
FIG. 5 is a flowchart describing one embodiment of a process for programming memory cells.

FIG. 5 is a flowchart describing one embodiment of a process for programming memory cells. For purposes of this document, the term program and programming are synonymous with write and writing. In one example embodiment, the process of FIG. 5 is performed for memory structure 202 using the one or more control circuits (e.g., system control logic 260, column control circuitry 210, row control circuitry 220) discussed above. In one example embodiment, the process of FIG. 5 is performed by integrated memory assembly 207 using the one or more control circuits (e.g., system control logic 260, column control circuitry 210, row control circuitry 220) of control die 211 to program memory cells on memory structure die 201. In one embodiment, circuitry on the die (e.g., memory die 200, control die 211) performs the programming process. The circuitry on the die may perform the programming process in response to a programming command received on interface 268. The command could be received from a memory controller or test circuitry. In one embodiment, the programming command is compliant with a memory interface protocol such as described in the Open NAND Flash Interface (ONFI) Specification. One example of a program command is the program command 80h in the ONFI Specification. However, the programming process of FIG. 5 is not limited to the program command 80h in the ONFI Specification.

The process includes multiple loops, each of which includes a program phase and a may include verify phase. Note that in some embodiments the verify phase is skipped in one or more of the loops. The process of FIG. 5 is performed to implement the full sequence programming, as well as other programming schemes including multi-stage programming. When implementing multi-stage programming, the process of FIG. 5 is used to implement any/each stage of the multi-stage programming process. The process may be used to program a test pattern into memory cells in a block under test.

Typically, the program voltage applied to the control gates (via a selected data word line) during a program operation is applied as a series of program pulses (e.g., voltage pulses). When programming user data typically one word line is selected for programming. However, when programming a test pattern into the memory cells multiple word lines may be selected for programming. In one embodiment, the entire block is programmed together during test. However, the magnitude of the program voltage applied to a particular word line during test may depend on the layer in which the particular word line resides.

Between programming pulses a set of verify pulses (e.g., voltage pulses) may be used to perform verification. In many implementations, the magnitude of the program pulses is increased with each successive pulse by a predetermined step size. In step 502 of FIG. 5, the programming voltage signal (Vpgm) is initialized to the starting magnitude (e.g., ~12-16V or another suitable level) and a program counter PC maintained by state machine 262 is initialized at 1. In an embodiment of programming a test pattern into the memory cells the magnitude of the initial program voltage (which may be referred to herein as Vpgmu) for a particular word line depends on what layer the particular word line resides.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the control die will pre-charge channels of NAND strings that include memory cells connected to the selected word line that are to be inhibited from programming. In step 506, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 508, a program voltage pulse of the programming voltage signal Vpgm is applied to the selected word line(s) (the word line(s) selected for programming). In an embodiment, the magnitude of the Vpgm for a particular word line will depend on the layer in which the particular word line resides. If a memory cell on a NAND string should be programmed, then the corresponding bit line is biased at a program enable voltage. In step 508, the program pulse is concurrently applied to all memory cells connected to the selected word line(s) so that all of the memory cells connected to the selected word line(s) are programmed concurrently (unless they are inhibited from programming). That is, they are programmed at the same time or during overlapping times (both of which are considered concurrent). In this manner all of the memory cells connected to the selected word line(s) will concurrently have their threshold voltage change, unless they are inhibited from programming.

In step 510, program verify is performed and memory cells that have reached their target states are locked out from further programming. Step 510 includes performing verification of programming by sensing at one or more verify reference levels. In one embodiment, the verification process is performed by testing whether the threshold voltages of the memory cells selected for programming have reached the appropriate verify reference voltage. In step 510, a memory cell may be locked out after the memory cell has been verified (by a test of the Vt) that the memory cell has reached its target state. For example, a memory cell may be locked out if it reaches a verify reference voltage.

If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all of the memory cells have reached their target threshold voltages (fail), then the programming process continues to step 516.

In step 516, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 524. If the program counter PC is less than the program limit value PL, then the process continues at step 526 during which time the Program Counter PC is incremented by 1 and the programming voltage signal Vpgm is stepped up to the next magnitude. For example, the next pulse for each respective word line will have a magnitude greater than the previous pulse by a step size ΔVpgm (e.g., a step size of 0.1-1.0 volts). After step 526, the process loops back to step 504 and another program pulse is applied to the selected word line(s) so that another iteration (steps 504-526) of the programming process of FIG. 5 is performed.

Figure 6:
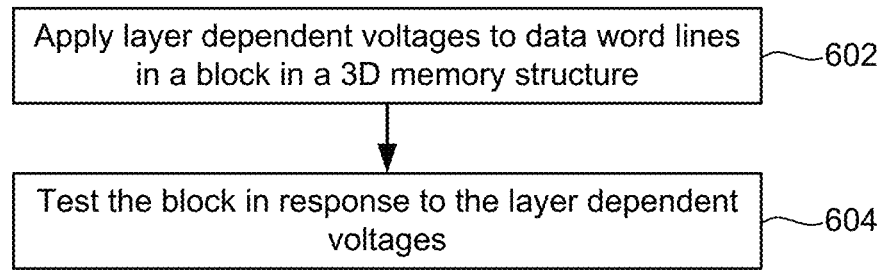
FIG. 6 is a flowchart of one embodiment of a process of testing a three-dimensional memory structure.

FIG. 6 is a flowchart of one embodiment of a process 600 of testing a three-dimensional memory structure 202. The memory structure 202 has layers of word lines and NAND strings of memory cells that extend through the layers of word lines. An example three-dimensional memory structure 202 is shown and described with respect to FIGS. 4-4E; however, process 600 is not limited to the architecture shown and described with respect FIGS. 4-4E. In one embodiment, process 600 is performed as a BIST by one or more control circuits that are in communication with the example three-dimensional memory structure 202. In one embodiment, the semiconductor die (e.g., 200, 211) enters a test mode prior to process 600. The one or more control circuits may include, but are not limited to, system control logic 260, state machine 262, power control 264, column control circuitry 210, and/or row control circuitry 220.

Step 602 includes applying a set of layer dependent voltages to a corresponding set of data word lines in a block in the 3D memory structure. The layer dependent voltages may be concurrently applied to the data word lines. A "layer dependent voltage" means that the magnitude of the voltage depends on which layer the word line to which the voltage is applied resides. Therefore, the magnitude of each voltage depends on the location of the word line in the block. A layer contains one or more contiguous data word lines. When a layer contains more than one data word line the data word lines are next to each other in a sequence of data word lines in the block. There are at least two different layers of word lines in a block. There may be more than two different layers. Thus, by concurrently applying a layer dependent voltage to each data word line in the set it is meant the each data word line in the set has applied thereto a voltage whose magnitude depends on which layer the data word line resides.

In one embodiment, the set of data word lines in step 602 contains all of the data word lines in the block. For example, the set of data word lines could include WL0-WL111 in an example in which there are 112 word lines in the block. However, the set of data word lines in step 602 is not required to contain every data word line in the block. For example, process 600 could be performed on the upper tier 421 separate from the lower tier 423.

In one embodiment, the layer dependent voltages are program voltages that are used to program a test pattern into the memory cells connected to the word lines. In one embodiment, the layer dependent voltages are relatively high magnitude voltages (e.g., about the same as a typical program voltage) that are used to test for short circuits in a leakage current test. These relatively high magnitude voltages may be referred to herein as stress voltages.

Step 604 includes testing the block in response to application of the layer dependent voltages. In one embodiment, step 604 includes programming a test pattern into the memory cells on each word line. The test pattern may be programmed by applying program voltages to the word lines. In one embodiment, the magnitude of the program voltage will depend on the location of the particular word line to which the program voltage is applied. In one embodiment, step 604 includes testing for leakage current in response to the layer dependent voltages. In this case, the voltage applied in step 602 may be considered to be a stress voltage that has a magnitude that depends on the particular word line to which the stress voltage is applied. Herein, a "stress voltage" is defined as a voltage that applies physical stress to the memory structure in order to test the memory structure for a defect. An example defect is a short circuit.

In an embodiment of step 604, the testing will pertain to each individual data word line to which the layer dependent voltage is applied. For example, by testing whether memory cells connected to a particular word line program successfully a test that pertains to that particular word line is made. As another example, step 604 could test for a short circuit between a particular word line and a local interconnect (LI). As another example, step 604 could test for a short circuit between a particular word line and a memory hole (MH).

Figure 7:
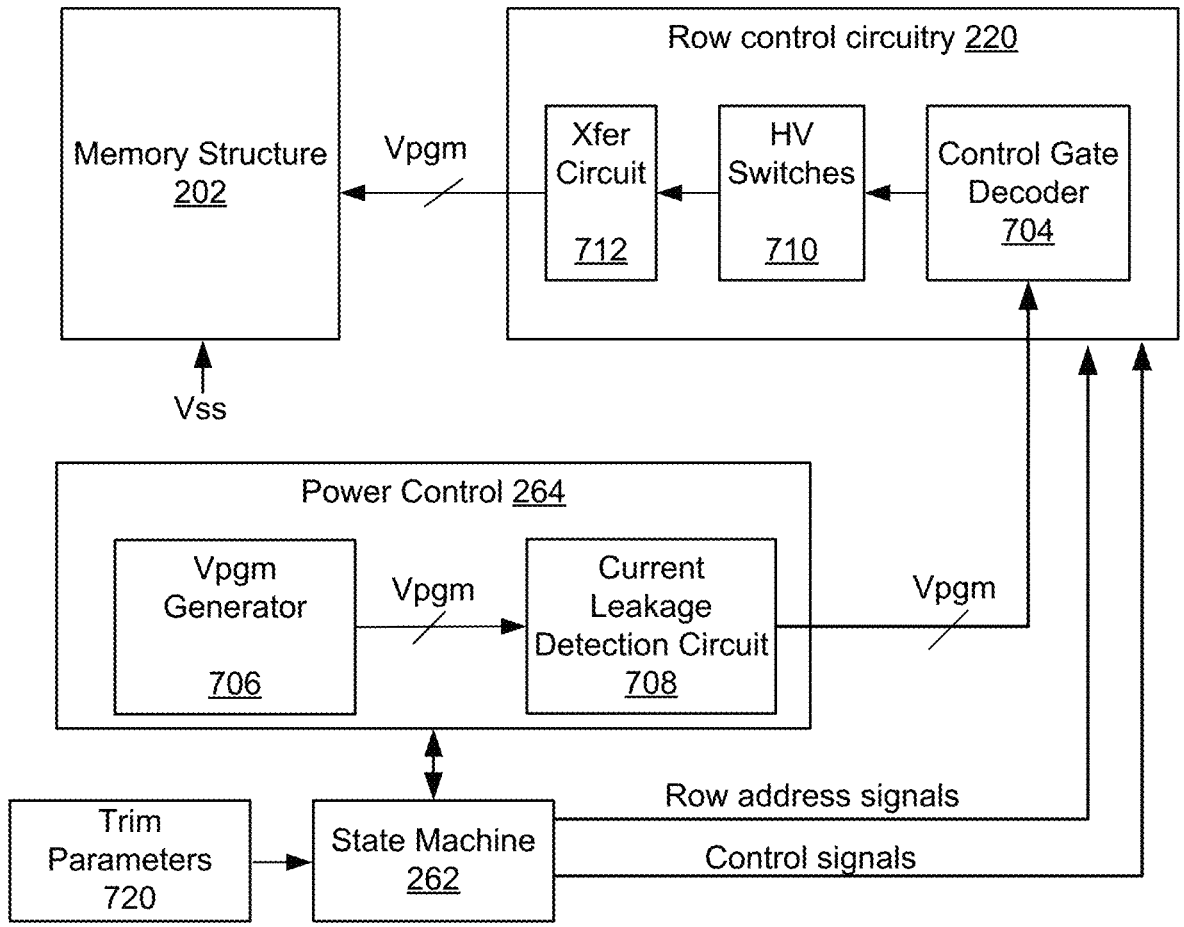
FIG. 7 is a block diagram of one embodiment of circuitry used for testing a memory structure.

FIG. 7 is a block diagram of one embodiment of circuitry used for testing a memory structure 202. In one embodiment, the voltage that is applied to the word lines is a program voltage (Vpgm). The row control circuitry 220 will apply the appropriate Vpgm to each data word line in the selected block in the memory structure 202. The magnitude of Vpgm depends on the which layer the word line resides. The row control circuitry 220 contains a control gate decoder 704, high voltage (HV) switches 710, and a transfer (xfer) circuit 712. The high-voltage (HV) switches 710 may contain a high voltage switch (e.g., transistor) for each word line in a selected block in the memory structure 202. The HV switches 710 pass these voltages to the transfer circuit 712, which provides the appropriate Vpgm to the word lines in the selected block. The transfer circuit 712 may contain transistors that pass the voltages.

The power control 264 contains a Vpgm generator 706 that is able to generate and provide program voltages of different magnitudes. The Vpgm generator 706 may contain one or more high voltage charge pumps, as well as other circuits such as voltage step down circuits. In one embodiment, a voltage step down circuit is able to step down the voltage from charge pump by a suitable amount to provide a Vpgm with the desired magnitude. However, note that the technique for providing the word line layer dependent Vpgms is not limited to the foregoing example.

The power control 264 optionally contains a current leakage detection circuit 708, which is able to detect weather there is a leakage current in memory structure 202 as a result of applying the Vpgms. In some embodiments, the leakage detection circuit 708 is not used and may be bypassed. For example, the Vpgms may be used to program a test pattern in which case the leakage detection circuit 708 is not required.

The state machine 262 controls the testing of the memory structure 202. The state machine 262 has access to trim parameters 720, which specify the magnitudes of the voltages to applied to the word lines during test of the memory structure 202. In one embodiment, the trim parameters 720 contain a table that indicates what layer each word line resides, as well as an offset voltage for that layer. The offset voltage may be added or subtracted from a base voltage to arrive at a voltage for that layer. The state machine 262 instructs the power control 264 to provide the appropriate magnitude Vpgms to the row control circuitry 220. The state machine 262 controls the row control circuitry 220 using row address signals and other control signals. The state machine 262 will control other circuitry such as the column control circuitry 210, but the column control circuitry 210 is not depicted in FIG. 7. The state machine 262 will control application of voltages other than Vpgm. One such other voltage is a low voltage (e.g., Vss) which may be applied to, for example, bit lines and a source line during a leakage current test.

Figure 8:
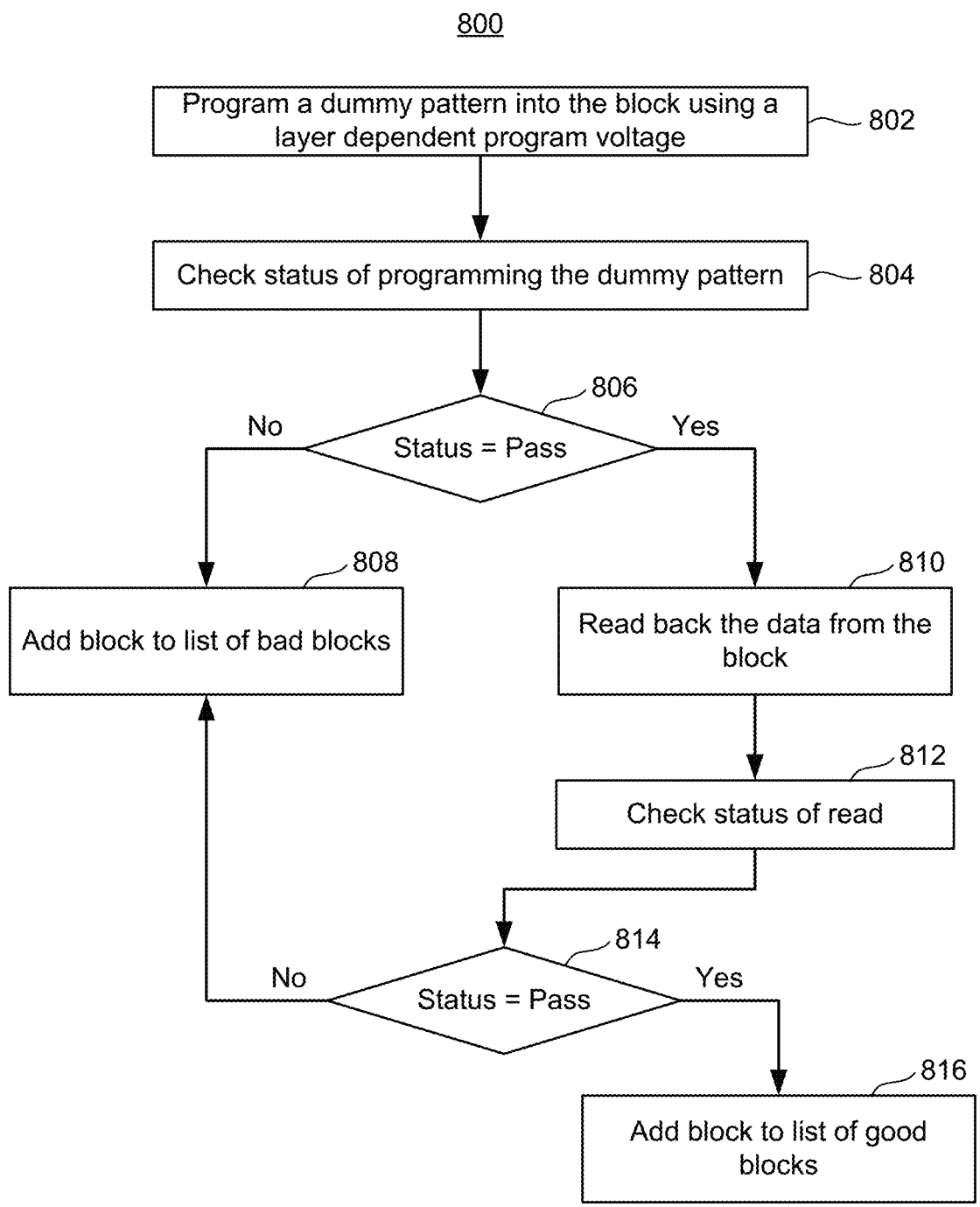
FIG. 8 is a flowchart of one embodiment of a process of testing a 3D memory structure by programming a test pattern (or dummy pattern) using a layer dependent program voltage.

FIG. 8 is a flowchart of one embodiment of a process 800 of testing a 3D memory structure by programming a test pattern (or dummy pattern) using a layer dependent program voltage. The process 800 provides further details for one embodiment of process 600. In one embodiment, process 800 is performed as a BIST by one or more control circuits that are in communication with a three-dimensional memory structure 202. In one embodiment, the semiconductor die (e.g., 200, 211) enters a test mode prior to process 800. The circuitry on the die may perform process 800 in response to a sequence of commands received on interface 268. Table I contains an example of the command sequence.

TABLE I

| CMD XX | // WL Layer Enable |
|---|---|
| CMD WW | // All Control Gate Driver Select |
| CMD ZZ | // Optional depending on whether Dummy Gates are selected |
| CMD 80; ADDR*5; CMD YY | // Program command |

In Table I, CMD XX, CMD WW, and CMD ZZ may be vender specific commands in a memory interface protocol. CMD XX enables the option to apply different voltages to the selected word lines at the same time. In other words, CMD XX enables the option to concurrently apply different voltages to the selected word lines. CMD WW is to select all the data word lines. Thus, the magnitude of the program voltages to the selected word lines may be layer dependent. Moreover, the data word lines may be programmed at the same time (or concurrently), which saves considerable time during the test of the 3D memory structure. CMD WW is to select all the dummy word lines. Thus, optionally, the dummy word lines may be programmed in process 800. An example of a memory interface protocol is described in the ONFI Specification; however, process 800 is not limited to the ONFI Specification. CMD 80 may be a programming command in the ONFI Specification. CMD YY could be 10 h (Auto Program) or 45 h (Manual Program) in an ONFI example. However, process 800 is not limited to the program command being compliant with the ONFI specification. For example, a different memory interface protocol could be used.

Step 802 includes programming a test pattern into memory cells in a block using a layer dependent program voltage. As one example, for each word line the test pattern could have an equal number of memory cells programmed to each of a number of data states. For example, first the memory cells could be erased to an erase state. Then, the memory cells on a word line may be programmed to one of seven programmed states, with some cells left in the erase state. In this example, each state will have $\frac{1}{8}^{th}$ of the memory cells. A different number of states could be used. Also, the test pattern is not limited to this example. In one embodiment, the program process is relatively fast due to selecting all of the data word lines in the block for programming at the same time. In one embodiment of step 802 a process similar to the programming process depicted in FIG. 5 is performed. Thus step 804 can include a number of program loops with the magnitude of the program pulse stepped up each loop.

Step 806 includes checking the status of programming the test pattern. In one embodiment, the status is checked based on the status of programming the test pattern such as in step 514 or 524 of FIG. 5. If the status is not pass, then the block may be added to a list of bad blocks in step 808. If programming the test pattern passed, then the data may be read back in step 810. In step 812, the status of the read is checked. The criterion for passing the read operation can vary. In one embodiment, the data that is read is compared with the test pattern. A count of the number of bits that are different from the test pattern may be made. If this number exceeds an allowed number, failure is indicated. In one embodiment, the data is provided to an ECC decoder, which detects errors and is capable of correcting errors. Pass or failure may be based on results of the decoding operation. For example, pass or failure may be based on a fail bit count (FBC), which is the number of bits in an ECC codeword that are in error. If the read status is a pass (step 814), then the block is added to a pool of good blocks in step 816. If the read status is a fail, then the block is added to a list of bad blocks in step 808.

Figure 9:
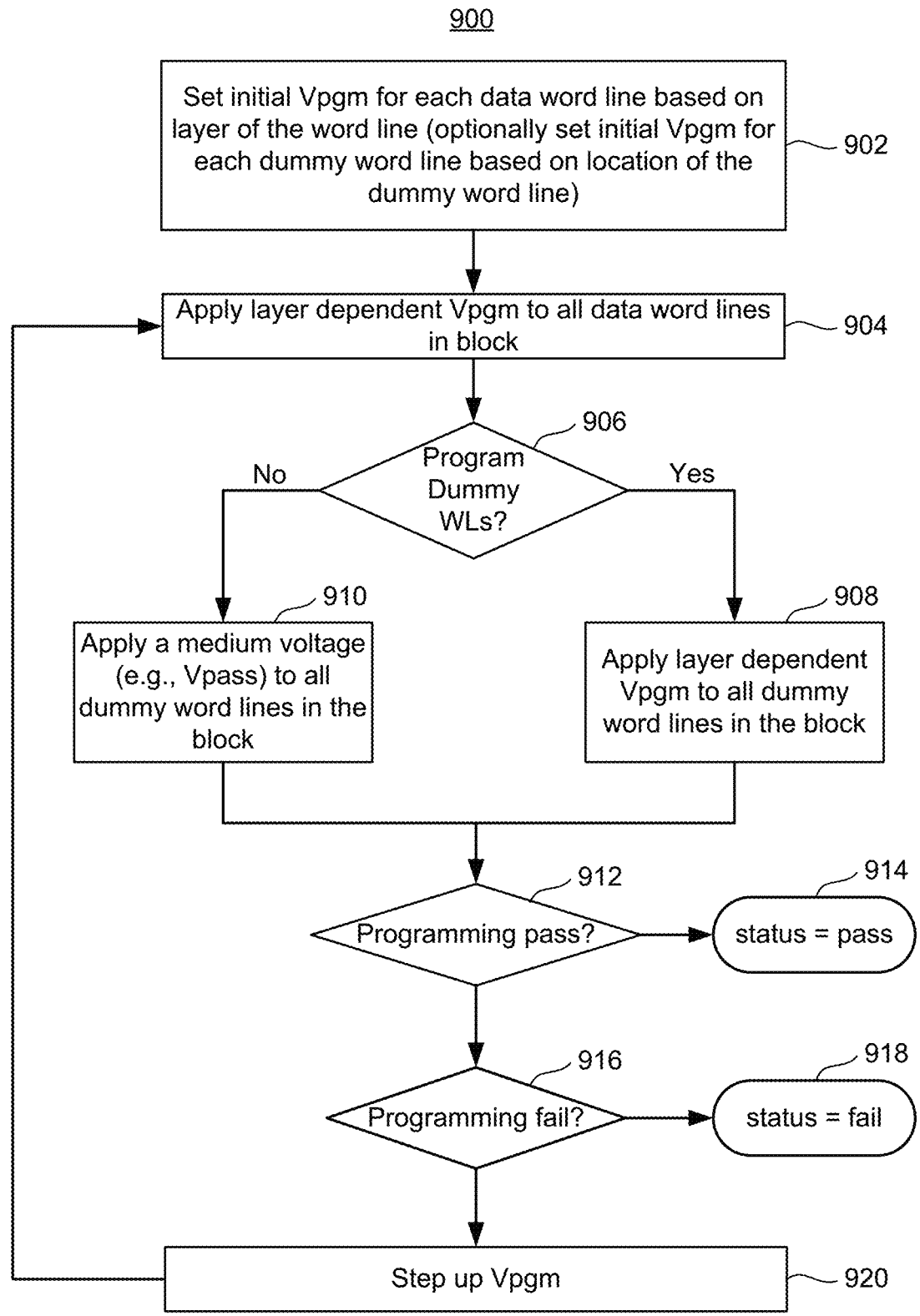
FIG. 9 is a flowchart of one embodiment of a process of testing a memory structure by programming using a layer dependent program voltage.

FIG. 9 is a flowchart of one embodiment of a process 900 of testing a memory structure by programming using a layer dependent program voltage. Process 900 provides further details of one embodiment of step 802 in process 800. In one embodiment, process 900 is performed as a BIST by one or more control circuits that are in communication with the example three-dimensional memory structure 202. In one embodiment, the semiconductor die (e.g., 200, 211) enters a test mode prior to process 900. Step 902 includes setting an initial Vpgm for each data word line based on a layer of the word line. Optionally, an initial Vpgm for each dummy word line based on a layer of the dummy word line met be set.

Step 904 includes applying a layer dependent Vpgm to each data word line in the block. Step 906 is a determination of whether memory cells connected to dummy word lines are to be programmed. If dummy word lines are to be programmed, in step 908 a layer dependent Vpgm is applied to each dummy word line in the block. If dummy word lines are not to be programmed, a medium voltage (e.g., Vpass) may be applied to all dummy word lines in the block in step 910. The voltage Vpass may be a voltage that is typically used as a boosting voltage that is applied to unselected word lines during programming. An unselected word line means a word line for which none of the memory cells connected thereto are to be programmed.

Step 912 includes a determination of whether programming passed. If so, the status is set to pass in step 914. Step 916 includes a determination of whether programming failed. If so, the status is set to fail in step 918. If the programming status is not yet pass or fail, then another program loop may be performed. In step 920 the magnitude of Vpgm for each word line is stepped up. After stepping up Vpgm, the magnitude of Vpgm will still be layer dependent. In one embodiment, the amount by which Vpgm is stepped up for each word line is the same. However, since the initial Vpgm was layer dependent the new magnitude of Vpgm will also be layer dependent. However, another option is to use a different step size for different layers, while still resulting in a new magnitude of Vpgm that is layer dependent.

Figure 10:
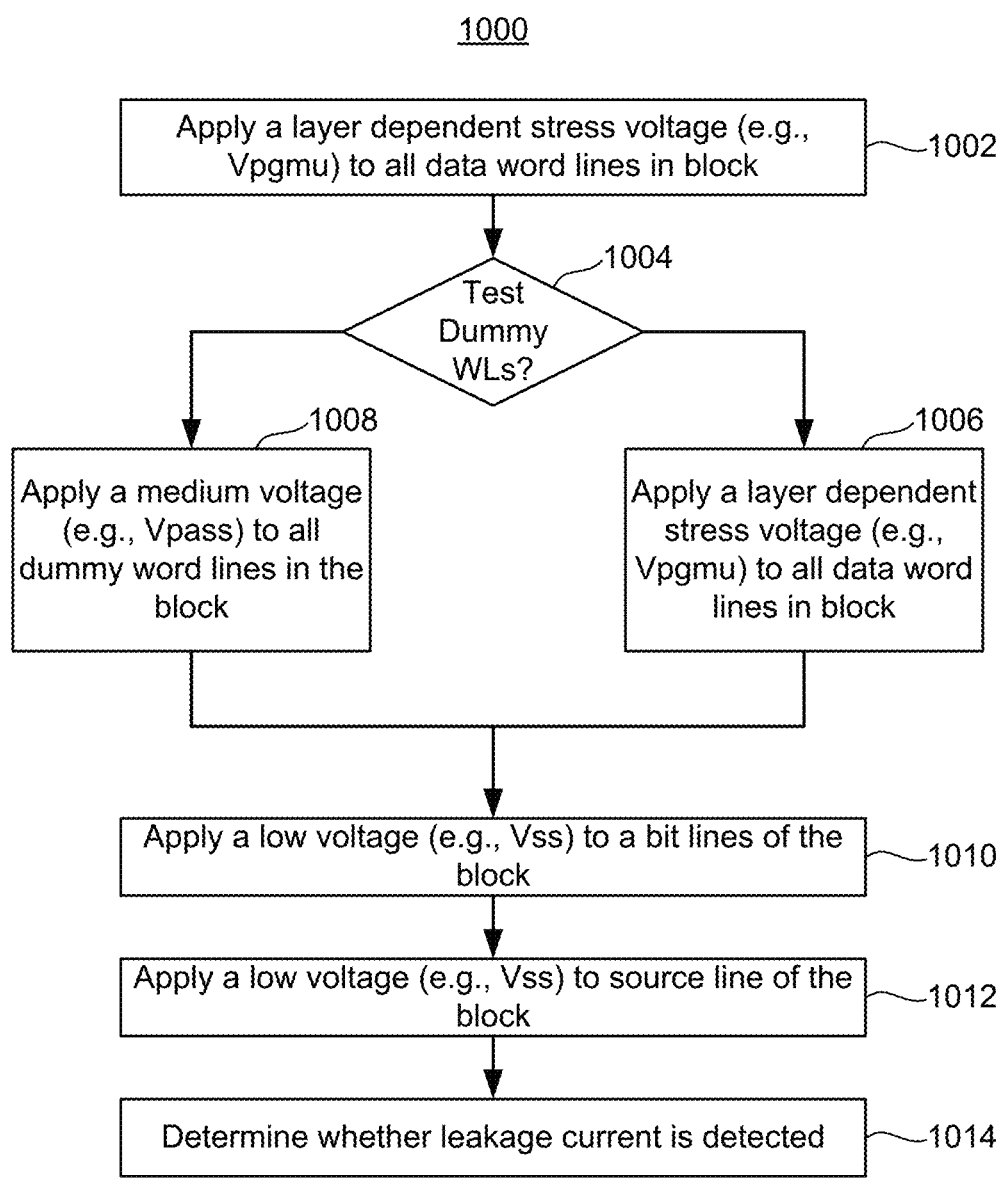
FIG. 10 is a flowchart of one embodiment of a process of a current leakage test in which the magnitude of the voltage applied to the word line is layer dependent.

In one embodiment, the test of the 3D memory structure includes a current leakage test. This current leakage test may be used to test for defects including, but not limited to, WL-LI defects 496 and WL-MH defects 487. FIG. 10 is a flowchart of one embodiment of a process 1000 of a current leakage test in which the magnitude of the voltage applied to the word line is layer dependent. Process 1000 provides further details for one embodiment of process 600. In one embodiment, process 1000 is performed as a BIST by one or more control circuits that are in communication with the example three-dimensional memory structure 202. In one embodiment, the semiconductor die (e.g., 200, 211) enters a test mode prior to process 1000. The circuitry on the die may perform process 1000 in response to a sequence of commands received on interface 268. Table II contains a simplified example of the command sequence. Details such as providing the addresses to be tested are not depicted in Table II.

TABLE II

| | |
|---|---|
| CMD XX | // WL Layer Enable |
| CMD ZZ | // Optional depending on whether Dummy Gates are selected |
| CMD XA | // Leak Detection |
| CMD XB | // Status Check |
| CMD XC | // Leak Detection Status Check |

CMD XX and CMD ZZ may be vender specific commands in a memory interface protocol as described above in connection with Table I. The other three commands are for the current leakage detection test. CMD XA, CMD XB, and CMD XC could be vender specific commands in a memory interface protocol. However one or more of CMD XA, CMD XB, and CMD XC could be commands that are specified in a memory interface protocol such as described in the ONFI Specification. However, process 1000 is not limited to the ONFI specification. For example, a different memory interface protocol could be used.

Step 1002 includes applying a layer dependent voltage to all data word lines in the block. This voltage may be referred to herein as a stress voltage. This layer dependent voltage may be a relatively high magnitude voltage. In one embodiment, the magnitude may be about the same as one of the program voltages used to program memory cells. In one embodiment, the layer dependent voltage is about the same as the initial program voltage (i.e., the program voltage in the first program loop). One option is for the voltage used in step 1002 to be the same for each word line as for the initial program voltage in step 902 of process 900. However, the layer dependent voltage is step 1002 is not required to be the initial program voltage in step 902.

Step 1004 is a determination of whether the dummy word lines are to be tested for leakage current. If dummy word lines are to be tested for leakage current, in step 1006 a layer dependent stress voltage is applied to each dummy word line in the block. If dummy word lines are not to be tested for leakage current, a medium voltage (e.g., Vpass) may be applied to all dummy word lines in the block in step 1008. The medium voltage has a significantly lower magnitude than the stress voltage.

Step 1010 includes applying a low voltage (e.g., Vss or about 0V) to bit lines in the block. Step 1012 includes applying a low voltage (e.g., Vss or about 0V) to the source line in the block. Step 1014 includes determining whether a leakage current is detected. In one embodiment, leakage current detection circuit 708 (see FIG. 7) monitors for a leakage current. In one embodiment, a leakage current may flow if there is a short circuit between any of the word lines in the block and the source line (or LI). In one embodiment, a leakage current may flow if there is a short circuit between any of the word lines in the block and the memory hole (e.g., the NAND string channel).

FIG. 11 is a table 1100 that provides further details of voltages applied during an embodiment of process 1000. A stress voltage (e.g., Vpgmu) is applied to all of the data word lines in this example, but a lower voltage (e.g., Vpass) may be applied to all of the dummy word lines, in this example. The data word lines in table 1100 include lower data in the lower tier and upper data word lines in the upper tier. The magnitude of the Vpgmu that is applied to the data word lines depends on which layer the data word line resides. The dummy word lines in table 1100 include one or more source side dummy WLs (DS), a dummy word line adjacent to the IF at the top of the lower tier (WLIFDL), a dummy word line adjacent to the IF at the bottom of the upper tier (WLIFDU), and one or more drain side dummy WLs (DD). Another option is applying the layer dependent Vpgmu to the dummy word lines.

A low voltage (e.g., Vss or 0V) is applied to both the bit lines (BL) and the source line (SL). The voltage Vsgd applied to the one or more SGD line may be a select voltage that turns on the drain side select gates. The voltage Vsgs applied to the one or more SGS line may be a select voltage that turns on the source side select gates. In one embodiment, the voltages that are applied as depicted in table 1100 will result in a high voltage (or stress voltage) on the data word lines and a low voltage on the NAND channel to test for a word line to memory hole short circuit 487. In one embodiment, the voltages that are applied as depicted in table 1100 will result in a high voltage on the word lines and a low voltage on the source line to test for a word line to LI short circuit 495.

FIG. 12 is a table 1200 that provides further details of layer dependent voltages applied during testing of a 3D memory structure. The table 1200 may be part of the trim parameters 720. The table has a column 1210 for word line layers and a column 1220 that specifies an offset to provide for a layer dependent voltage. In practice the offset in column 1220 may be added or subtracted from a base voltage. For example, the memory system may have a base initial program voltage (Vpgmu). The offset in column 1220 may be added to or subtracted from Vpgmu, as one example. The table 1200 may be used in various processes discussed herein such as, but not limited to, step 602 in process 600, step 802 in process 800, step 902 in process 900, step 1002 in process 1000, and/or step 1006 in process 1000.

Table 1200 covers an example in which there are 112 word lines in two tiers 421, 423 consistent with the examples in FIGS. 4C and 4E. Table 1200 shows that there may be as few as a single word line in a layer such as "edge" word lines WL0, WL1, WL110, and WL111. Also, WL55 and WL56 may be considered edge word lines as they are at an edge of the lower tier 423 and upper tier 421, respectively. WL Layer 0, WL Layer 1, and WL Layer 2 each contain multiple contiguous word lines in the lower tier 423. WL Layer 3, WL Layer 4, WL Layer 5, and WL layer 6 each contain multiple contiguous word lines in the upper tier 421.

Figure 13A:
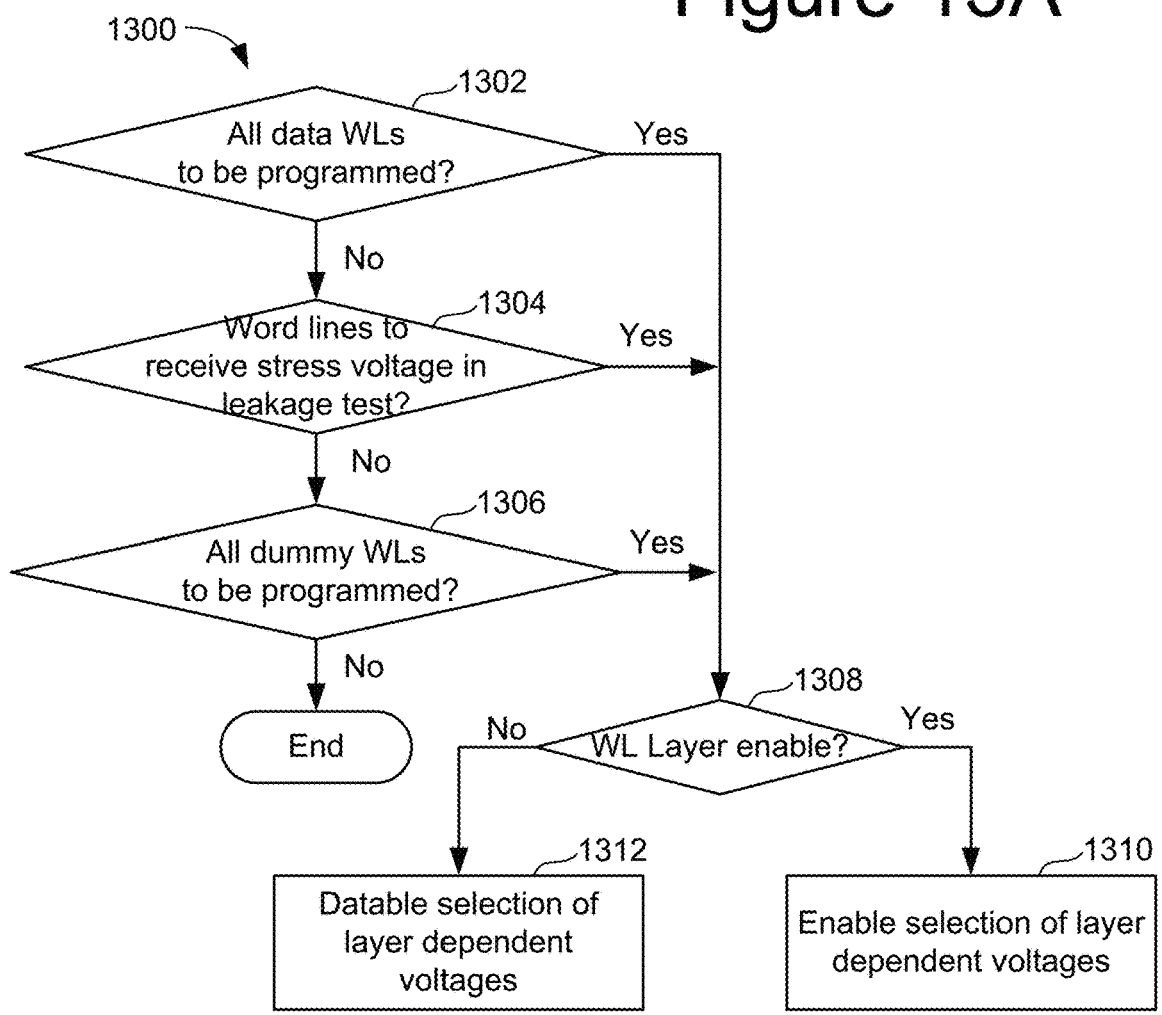
FIG. 13A depicts flowchart of one embodiment of a process of enabling or disabling the ability to apply layer dependent voltages to the word lines depending on whether the memory system is in a WL layer enable mode.

In some embodiments, the memory system will enable or disable the ability to apply layer dependent voltages to the word lines depending on whether the memory system is in a WL layer enable mode. FIG. 13A depicts flowchart of one embodiment of a process 1300 of enabling or disabling the ability to apply layer dependent voltages to the word lines depending on whether the memory system is in a WL layer enable mode. Steps 1302, 1304, and 1306 each include conditions that test for whether a particular action is to be taken. In one embodiment, these actions are trigged in response to issuance of a specific command to the semiconductor die (e.g., 200, 211). In one embodiment, one or more of these commands are vender specific commands in accordance with a memory interface protocol such as described in the Open NAND Flash Interface Specification (ONFI). Step 1302 is a determination of whether all data word lines are to be programmed. Recall that all data word lines are to be programmed in an embodiment of process 800. CMD ZZ in Table I is one example of a command to select all data word lines. Step 1304 is a determination of whether all data word lines are to receive a high voltage for a leakage test. Recall that all data word lines receive a stress voltage for a leakage test in an embodiment of process 1000. CMD XA in Table II is one example of a command to invoke a current leakage test. Step 1306 is a determination of whether all dummy word lines are to be programmed. Recall that all dummy word lines are to be programmed in an embodiment of process 800. CMD ZZ in Table I or II is one example of a command to select all dummy word lines. If none of these conditions apply then the process ends with no further action. If any of these conditions is met then in step 1308 a determination is made as to whether a WL layer enable mode has been invoked. In one embodiment, the WL layer enable is invoked by the issuance of a command to the semiconductor die (e.g., 200, 211). CMD XX in Table I or II is one example of a command to enable WL layer specific voltages. In one embodiment, this command is a vender specific command in accordance with a memory interface protocol. An example of a memory interface protocol is described in the ONFI specification. If the test mode has been invoked then in step 1310 the selection of layer dependent voltages is enabled. If the test mode has not been invoked then in step 1312 the selection of layer dependent voltages is disabled.

Figure 13B:
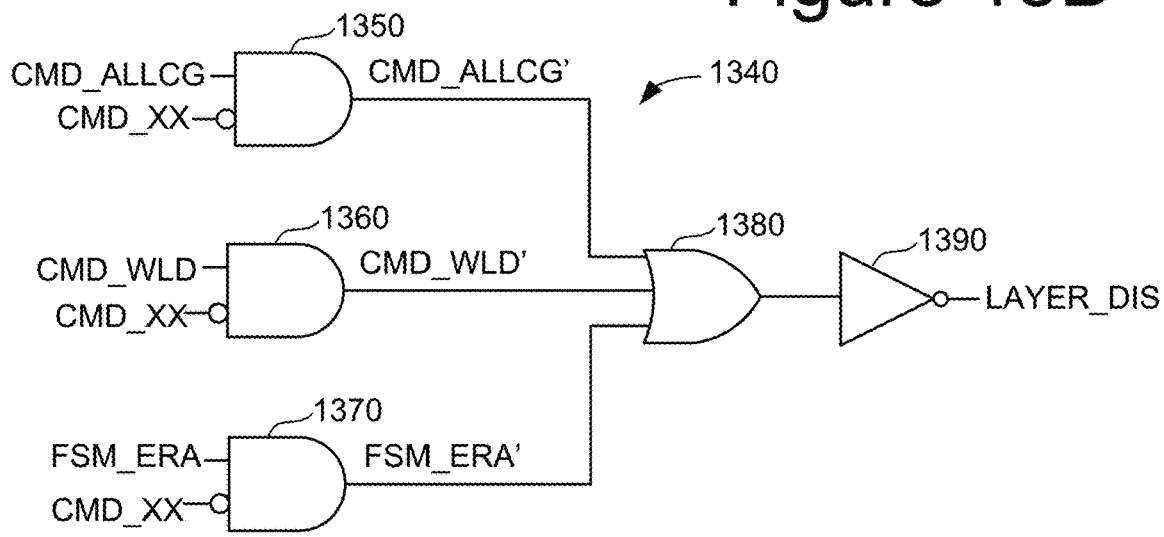
FIG. 13B is a schematic diagram of one embodiment of circuitry for enabling or disabling the selection of layer dependent voltages.

FIG. 13B is a schematic diagram of one embodiment of circuitry 1340 for enabling or disabling the selection of layer dependent voltages to word lines. In one embodiment, the circuitry 1340 resides in state machine 262. The circuitry 1340 may include combinational logic. The circuitry 1340 includes three NIMPLY gates 1350, 1360, and 1370, which receive input signals. Those input signals include a test mode signal CMD_XX, which may have a value of 1 to invoke the test mode and a value of 0 when the test mode is not invoked. In an embodiment, the test mode signal CMD_XX is generated in response to the CMD XX (see Table I or II). The signal CMD_ALLCG is a signal that all data control gates will be selected (e.g., all data word lines are to be programmed). In an embodiment, the signal CMD_ALLCG is generated in response to the CMD WW (see Table I). The signal CMD_WLD is a command that all dummy control gates will be selected (e.g., all dummy word lines are to be programmed). In an embodiment, the signal CMD_WLD is generated in response to the CMD ZZ (see Table I or II). The signal FSM_ERA is a command that a word line leakage test is to be performed. In an embodiment, the signal FSM_ERA is generated in response to the CMD XA (see Table II). The outputs of NIMPLY gates 1350, 1360, and 1370 are provided to the OR gate 1380. The output of the OR gate 1380 is provided to the input of the inverter 1390, which provides the final signal to either enable or disable the ability to select layer dependent voltages. In one embodiment, the signal LAYER_DIS controls whether table 1200 is allowed to be used for layer dependent word line voltages.

In view of the foregoing, a first embodiment includes an apparatus comprising a memory structure comprising a three-dimensional memory structure comprising layers of data word lines and NAND strings of non-volatile memory cells that extend through the layers of the word lines. Each data word line is connected to a group of the non-volatile memory cells on different NAND strings. The apparatus comprises one or more control circuits in communication with the three-dimensional memory structure. The one or more control circuits are configured to concurrently apply a set of test voltages to a corresponding set of the data word lines in the three-dimensional memory structure. The test voltage applied to a particular data word line has a magnitude that depends on which layer the particular data word line resides. The one or more control circuits are configured to test the three-dimensional memory structure in response to the set of test voltages applied to the corresponding set of the data word lines.

In a second embodiment, in furtherance to the first embodiment, the set of the data word lines comprise all data word lines in a block that comprises a plurality of the NAND strings.

In a third embodiment, in furtherance to the first or second embodiments, each test voltage in the set of test voltages is a program voltage having a magnitude that depends on which layer the data word line to which the program voltage is applied resides.

In a fourth embodiment, in furtherance to any of the first to third embodiments, to test the three-dimensional memory structure with the set of test voltages applied to the corresponding set of the data word lines the one or more control circuits are configured to program a test pattern into the memory cells connected to the data word lines by applying a series of program voltages to each data word line. Each program voltage has a magnitude that depends on which layer the data word line to which the program voltage is applied resides.

In a fifth embodiment, in furtherance the fourth embodiment, the one or more control circuits are further configured to program the test pattern into memory cells connected to a plurality of dummy word lines in a block that comprises the data word lines and a plurality of the NAND strings by applying a series of program voltages to each dummy word line. Each program voltage applied to a particular dummy word line has a magnitude that depends on which layer in the three-dimensional memory structure the particular dummy word line resides.

In a sixth embodiment, in furtherance the any of the first to fifth embodiments, each test voltage in the set of test voltages is a stress voltage having a magnitude that depends on which layer the data word line to which the stress voltage is applied resides.

In a seventh embodiment, in furtherance to the any of the first to sixth embodiments, to test the three-dimensional memory structure with the set of test voltages applied to the corresponding set of the data word lines the one or more control circuits are configured to apply a low voltage to one or more regions of the three-dimensional memory structure while applying the set of test voltages to the corresponding set of the data word lines. Each test voltage in the set of test voltages has a magnitude that is greater than the low voltage. The one or more control circuits are configured to determine whether a leakage current results from application of the set of test voltages to the data word lines and the low voltage to the one or more regions.

In an eighth embodiment, in furtherance to the seventh embodiment, the one or more control circuits are further configured to apply a set of stress voltages to a corresponding set of dummy word lines in the three-dimensional memory structure while the set of test voltages are applied to the corresponding set of the data word lines and the low voltage is applied to the one or more regions. The stress voltage applied to a particular dummy word line has a magnitude that depends on which layer the particular dummy word line resides. Each stress voltage has a magnitude that is greater than the low voltage.

In a ninth embodiment, in furtherance to any of the first to eighth embodiments, the one or more control circuits are further configured to apply a set of test voltages to a corresponding set of dummy word lines in the three-dimensional memory structure while the set of test voltages are applied to the corresponding set of the data word lines. The test voltage applied to a particular dummy word line has a magnitude that depends on which layer the particular dummy word line resides.

In a tenth embodiment, in furtherance to any of the first to ninth embodiments, the one or more control circuits comprise combinational logic having an input configured to receive a signal that invokes a word line layer dependent voltage mode and an output configured to provide a signal to enable word line layer dependent voltages.

One embodiment includes a method for testing a three dimensional memory block having a plurality of data word line layers and a plurality of NAND strings that extend through the plurality of data word line layers, the method comprising. The method comprises applying a location dependent voltage to each data word line layer in the block at the same time. A magnitude of the location dependent voltage applied to each particular data word line layer depends on the location within the block of the particular data word line layer. The method comprises testing the block while applying the location dependent voltage to each data word line layer in the block. The testing pertains to each individual data word line layer to which the location dependent voltage is applied.

One embodiment includes a non-volatile storage system. The system comprises a three-dimensional memory structure comprising blocks each having layers of data word lines and NAND strings extending through the layers of data word lines. Each NAND string comprises non-volatile memory cells. Each data word line is connected to a group of the non-volatile memory cells on different NAND strings. The system comprises means for concurrently applying a voltage to each data word line in a block in the three-dimensional memory structure. A magnitude of the voltage applied to each data word line depends on a location of the data word line in the block. The system comprises means for testing the block while each respective voltage is concurrently applied to each data word line in the block.

In an embodiment, the means for concurrently applying a voltage to each data word line in a block in the three-dimensional memory structure comprises one or more of state machine 262, power control 264, system control logic 260, row control circuitry 220, Vpgm generator 706, charge pumps, control gate decoder 704, HV switches 710, transfer circuit 712, a processor, an FPGA, an ASIC, and/or an integrated circuit. In an embodiment, the means for concurrently applying a voltage to each data word line in a block in the three-dimensional memory structure performs steps 902-910 and 920 of process 900 in FIG. 9. In an embodiment, the means for concurrently applying a voltage to each data word line in a block in the three-dimensional memory structure performs steps 1002-1008 of process 1000 in FIG. 10.

In an embodiment, the means for testing the block while each respective voltage is concurrently applied to each data word line in the block comprises one or more of state machine 262, power control 264, system control logic 260, row control circuitry 220, column control circuitry 210, leakage detection circuit 708, a processor, an FPGA, an ASIC, and/or an integrated circuit. In an embodiment, the means for testing the block while each respective voltage is concurrently applied to each data word line in the block performs steps 912-918 of process 900 in FIG. 9. In an embodiment, the means for concurrently applying a voltage to each data word line in a block in the three-dimensional memory structure performs steps 1010-1014 of process 1000 in FIG. 10.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
    a three-dimensional memory structure comprising layers of data word lines and NAND strings of non-volatile memory cells that extend through the layers of the data word lines, wherein each data word line is connected to a group of the non-volatile memory cells on different NAND strings; and
    one or more control circuits in communication with the three-dimensional memory structure, wherein the one or more control circuits are configured to:
        concurrently apply a set of test voltages to a corresponding set of the data word lines in the three-dimensional memory structure, wherein the test voltage applied to a particular data word line has a magnitude that depends on which layer the particular data word line resides; and
        test the three-dimensional memory structure in response to the set of test voltages concurrently applied to the corresponding set of the data word lines.

2. The apparatus of claim 1, wherein the set of the data word lines comprise all data word lines in a block that comprises a plurality of the NAND strings.

3. The apparatus of claim 1, wherein each test voltage in the set of test voltages is a program voltage having a magnitude that depends on which layer the data word line to which the program voltage is applied resides.

4. The apparatus of claim 1, wherein to test the three-dimensional memory structure with the set of test voltages concurrently applied to the corresponding set of the data word lines the one or more control circuits are configured to:
program a test pattern into the memory cells connected to the data word lines by applying a series of program voltages to each data word line, wherein each program voltage has a magnitude that depends on which layer the data word line to which the program voltage is applied resides.

5. The apparatus of claim 4, wherein the one or more control circuits are further configured to:
program the test pattern into memory cells connected to a plurality of dummy word lines in a block that comprises the data word lines and a plurality of the NAND strings by applying a series of program voltages to each dummy word line, wherein each program voltage applied to a particular dummy word line has a magnitude that depends on which layer in the three-dimensional memory structure the particular dummy word line resides.

6. The apparatus of claim 1, wherein each test voltage in the set of test voltages is a stress voltage having a magnitude that depends on which layer the data word line to which the stress voltage is applied resides.

7. The apparatus of claim 1, wherein to test the three-dimensional memory structure with the set of test voltages applied to the corresponding set of the data word lines the one or more control circuits are configured to:
apply a low voltage to one or more regions of the three-dimensional memory structure while concurrently applying the set of test voltages to the corresponding set of the data word lines, wherein each test voltage in the set of test voltages has a magnitude that is greater than the low voltage; and
determine whether a leakage current results from application of the set of test voltages to the data word lines and the low voltage to the one or more regions.

8. The apparatus of claim 7, wherein the one or more control circuits are further configured to:
concurrently apply a set of stress voltages to a corresponding set of dummy word lines in the three-dimensional memory structure while the set of test voltages are concurrently applied to the corresponding set of the data word lines and the low voltage is applied to the one or more regions, wherein the stress voltage concurrently applied to a particular dummy word line has a magnitude that depends on which layer the particular dummy word line resides, wherein each stress voltage has a magnitude that is greater than the low voltage.

9. The apparatus of claim 1, wherein the one or more control circuits are further configured to:
concurrently apply a set of test voltages to a corresponding set of dummy word lines in the three-dimensional memory structure while the set of test voltages are applied to the corresponding set of the data word lines, wherein the test voltage applied to a particular dummy word line has a magnitude that depends on which layer the particular dummy word line resides.

10. The apparatus of claim 1, wherein the one or more control circuits comprise:
combinational logic having an input configured to receive a signal that invokes a word line layer dependent voltage mode and an output configured to provide a signal to enable word line layer dependent voltages.

11. A method for testing a three dimensional memory block having a plurality of data word line layers and a plurality of NAND strings that extend through the plurality of data word line layers, the method comprising:
applying a location dependent voltage to each data word line layer in the block at the same time, wherein a magnitude of the location dependent voltage applied to each particular data word line layer depends on the location within the block of the particular data word line layer; and
testing the block while applying the location dependent voltage to each data word line layer in the block, wherein the testing pertains to each individual data word line layer to which the location dependent voltage is applied.

12. The method of claim 11, wherein:
applying the location dependent voltage to each data word line layer in the block at the same time comprises applying a location dependent program voltage to each data word line layer in the block, wherein a magnitude of the location dependent program voltage applied to each data word line layer depends on the location within the block of the word line layer; and
testing the block while applying the voltage to each data word line layer in the block at the same time comprises programming memory cells connected to the data word line layers.

13. The method of claim 11, wherein:
applying the location dependent voltage to each data word line layer in the block at the same time comprises applying a high voltage to each data word line layer in the block while applying a low voltage to a source line of the block and while applying low voltages to bit lines of the block, wherein a magnitude of the high voltage applied to each data word line layer depends on the location within the block of the data word line layer, wherein each high voltage has a greater magnitude than each low voltage; and
testing the block while applying the voltage to each data word line layer in the block at the same time comprises testing for leakage current in response to applying the high voltage to each data word line layer while applying the low voltage to the source line of the block and while applying the low voltages to the bit lines of the block.

14. The method of claim 11, further comprising:
applying a location dependent voltage to each dummy word line layer in the block while applying the location dependent voltage to each data word line layer in the block, wherein a magnitude of the location dependent voltage applied to a particular dummy word line layer in the block depends on the location within the block of the particular dummy word line layer.

15. A non-volatile storage system, the system comprising:
a three-dimensional memory structure comprising blocks each having layers of data word lines and NAND strings extending through the layers of data word lines, each NAND string comprising non-volatile memory cells, wherein each data word line is connected to a group of the non-volatile memory cells on different NAND strings;
means for concurrently applying a voltage to each data word line in a block in the three-dimensional memory structure, wherein a magnitude of the voltage applied to a particular data word line depends on a location of the particular data word line in the block; and means for testing the block while the voltages are concurrently applied to each particular data word line in the block.

16. The non-volatile storage system of claim 15, wherein the means for concurrently applying a voltage to each data word line in the block in the three-dimensional memory structure is configured to:
apply a location dependent program voltage to each data word line in the block, wherein the location dependent program voltage applied to a particular data word line has a magnitude that depends on the location within the block of the particular data word line.

17. The non-volatile storage system of claim 16, wherein the means for testing the block while the voltages are concurrently applied to each particular data word line in the block is configured to:
program a test pattern into the memory cells connected to the data word lines using the location dependent program voltages, wherein the location dependent program voltage applied to a particular data word line has a magnitude that depends on the location within the block of the particular data word line; and
determine whether the test pattern was successfully programmed.

18. The non-volatile storage system of claim 15, wherein:
the means for concurrently applying a voltage to each data word line in a block in the three-dimensional memory structure is configured to apply a location dependent stress voltage to each data word line in the block, wherein the location dependent stress voltage applied to a particular data word line has a magnitude that depends on the location within the block of the particular data word line; and the means for testing the block while the voltages are concurrently applied to each data word line in the block is configured to:
apply a low voltage to bit lines in the block while applying the location dependent stress voltage to each data word line in the block; and
apply a low voltage to a source line in the block while applying the location dependent stress voltage to each data word line in the block, wherein each stress voltage has a greater magnitude than the low voltage.

19. The non-volatile storage system of claim 18, wherein the means for testing the block while the voltages are concurrently applied to each particular data word line in the block is configured to:
determine whether there is a leakage current involving any of the data word lines in response to the location dependent stress voltages applied to each data word line in the block.

20. The non-volatile storage system of claim 15, wherein the means for concurrently applying a voltage to each data word line in a block in the three-dimensional memory structure is further configured to:
concurrently apply a location dependent voltage to each dummy word line in the block while concurrently applying the voltage to each data word line in the block, wherein the location dependent voltage applied to a particular dummy word line has a magnitude that depends on the location within the block of the particular dummy word line.

* * * * *